(12) United States Patent
Nagata

(10) Patent No.: US 12,356,753 B2
(45) Date of Patent: Jul. 8, 2025

(54) IMAGING DEVICE AND METHOD FOR MANUFACTURING IMAGING DEVICE

(71) Applicant: SONY SEMICONDUCTOR SOLUTIONS CORPORATION, Kanagawa (JP)

(72) Inventor: Masaya Nagata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 346 days.

(21) Appl. No.: 17/780,293

(22) PCT Filed: Sep. 30, 2020

(86) PCT No.: PCT/JP2020/037159
§ 371 (c)(1),
(2) Date: May 26, 2022

(87) PCT Pub. No.: WO2021/111715
PCT Pub. Date: Jun. 10, 2021

(65) Prior Publication Data
US 2022/0415953 A1 Dec. 29, 2022

(30) Foreign Application Priority Data
Dec. 4, 2019 (JP) .................................. 2019-219543

(51) Int. Cl.
*H10F 39/00* (2025.01)
*H01L 23/00* (2006.01)

(52) U.S. Cl.
CPC ............ *H10F 39/811* (2025.01); *H01L 24/05* (2013.01); *H01L 24/19* (2013.01); *H01L 24/20* (2013.01);
(Continued)

(58) Field of Classification Search
CPC ... H01L 27/14636; H01L 24/05; H01L 24/19; H01L 24/20; H01L 27/14618;
(Continued)

(56) References Cited

U.S. PATENT DOCUMENTS

2015/0061102 A1* 3/2015 Lin .................... H01L 21/76898
257/692
2016/0268326 A1* 9/2016 Yu ...................... H01L 27/14618
(Continued)

FOREIGN PATENT DOCUMENTS

| CN | 106571377 A | 4/2017 |
| CN | 108293088 A | 7/2018 |

(Continued)

OTHER PUBLICATIONS

International Search Report and Written Opinion of PCT Application No. PCT/JP2020/037159, issued on Dec. 1, 2020, 09 pages of ISRWO.

*Primary Examiner* — Jonathan Han
(74) *Attorney, Agent, or Firm* — CHIP LAW GROUP

(57) ABSTRACT

An imaging device to which a simple mounting method can be applied is configured. The imaging device is provided with an imaging element, a wiring substrate, and a sealing portion. The imaging element is provided with an image pickup chip over which an light transmitting portion transmitting incident light is arranged and which generates an image signal on the basis of the incident light that has passed through the light transmitting portion, and a pad which is arranged on a bottom surface of the image pickup chip different from a surface on which the light transmitting portion is arranged, which the pad transmitting the generated image signal. The wiring substrate has wiring connected to the pad and extending to a region outside the imaging element, and has the imaging element arranged on a surface thereof. The sealing portion is arranged adjacent to a side (Continued)

surface which is a surface adjacent to the bottom surface of the imaging element, and seals the imaging element.

12 Claims, 16 Drawing Sheets

(52) U.S. Cl.
CPC ............ *H10F 39/804* (2025.01); *H01L 24/13* (2013.01); *H01L 24/16* (2013.01); *H01L 2224/05573* (2013.01); *H01L 2224/05647* (2013.01); *H01L 2224/13144* (2013.01); *H01L 2224/13147* (2013.01); *H01L 2224/13666* (2013.01); *H01L 2224/16227* (2013.01); *H01L 2224/19* (2013.01); *H01L 2224/211* (2013.01); *H01L 2224/214* (2013.01); *H01L 2224/215* (2013.01); *H01L 2924/01022* (2013.01); *H01L 2924/01029* (2013.01); *H01L 2924/01079* (2013.01)

(58) Field of Classification Search
CPC ................ H01L 24/13; H01L 24/16; H01L 2224/05573; H01L 2224/05647; H01L 2224/13144; H01L 2224/13147; H01L 2224/13666; H01L 2224/16227; H01L 2224/19; H01L 2224/211; H01L 2224/214; H01L 2224/215; H01L 2924/01022; H01L 2924/01029; H01L 2924/01079; H01L 27/14685; H10F 39/811; H10F 39/804; H10F 39/024
See application file for complete search history.

(56) References Cited

U.S. PATENT DOCUMENTS

| | | | |
|---|---|---|---|
| 2018/0006070 | A1 | 1/2018 | Isobe |
| 2018/0102321 | A1* | 4/2018 | Ho ............................ H01L 24/05 |
| 2018/0138225 | A1* | 5/2018 | Kim ...................... H01L 21/565 |
| 2018/0277583 | A1 | 9/2018 | Harazono |

FOREIGN PATENT DOCUMENTS

| | | | |
|---|---|---|---|
| EP | 4071794 | A1 | 10/2022 |
| JP | 02-026080 | A | 1/1990 |
| JP | 03-021859 | U | 3/1991 |
| JP | 2004296453 | A | 10/2004 |
| JP | 2018-078274 | A | 5/2018 |
| KR | 10-2018-0090262 | A | 8/2018 |
| WO | 2016/129409 | A1 | 8/2016 |
| WO | 2017/094777 | A1 | 6/2017 |

\* cited by examiner

D

E

F

G

H

A

B

C

D

E

F

91

G

91

IMAGING DEVICE AND METHOD FOR MANUFACTURING IMAGING DEVICE

CROSS REFERENCE TO RELATED APPLICATIONS

This application is a U.S. National Phase of International Patent Application No. PCT/JP2020/037159 filed on Sep. 30, 2020, which claims priority benefit of Japanese Patent Application No. JP 2019-219543 filed in the Japan Patent Office on Dec. 4, 2019. Each of the above-referenced applications is hereby incorporated herein by reference in its entirety.

TECHNICAL FIELD

The present disclosure relates to an imaging device and a method for manufacturing the imaging device. To be specific, the present disclosure relates to an imaging device in which pads of a semiconductor chip constituting an imaging element are rearranged and enclosed in a package, and a method for manufacturing the imaging device.

BACKGROUND ART

Conventionally, an imaging device having a package miniaturized to a size of a semiconductor chip has been used. For example, there has been proposed an image sensor device in which a third semiconductor chip and a second semiconductor chip are stacked and a fan-out wafer level package containing a first semiconductor chip is connected via solder bumps on a back surface side of the second semiconductor chip (see, for example, PTL 1.). This third semiconductor chip constitutes an image sensor. The third semiconductor chip generates an image signal on the basis of incident light applied to a light receiving surface thereof, and outputs the image signal to the second semiconductor chip stacked on a back surface side thereof, which is a surface different from the light receiving surface. A logic circuit that processes the image signal generated by the image sensor is arranged on the second semiconductor chip, and outputs the processed image signal to the first semiconductor chip. A memory for holding the image signal processed by the logic circuit is arranged on the first semiconductor chip.

In this conventional technique, the third semiconductor chip and the second semiconductor chip are in a bare chip state, whereas the first semiconductor chip is enclosed in a fan-out wafer level package. Here, the fan-out wafer level package (FOWLP: Fan Out Wafer Level Package) is a package in which a region of rewiring drawn from a pad of a semiconductor chip is extended to a region of a sealing material around the semiconductor chip and is a package that can widen a wiring region, compared to a CSP (Chip Size Package).

CITATION LIST

Patent Literature

[PTL 1]
JP 2018-078274A

SUMMARY

Technical Problem

The above-mentioned conventional technique has a problem that it is difficult to mount the image sensor device. The output image signal of the image sensor device described above is output to a pad arranged on the light receiving surface side of the third semiconductor chip. Therefore, it is necessary to connect a bonding wire or the like to the pad on the light receiving surface side to take out an image signal, which makes it difficult to mount the image sensor device.

The present disclosure has been made in view of the above-mentioned problem, and an object of the present disclosure is to configure an imaging device to which a simple mounting method can be applied.

Solution to Problem

The present disclosure has been made to solve the above-mentioned problem, and a first aspect thereof is an imaging device including an imaging element including an image pickup chip over which a light transmitting portion transmitting incident light is arranged and which generates an image signal on the basis of the incident light transmitted through the light transmitting portion and a pad which is arranged on a bottom surface that is a surface of the image pickup chip different from a surface on which the light transmitting portion is arranged, the pad transmitting the generated image signal, a wiring substrate which has wiring connected to the pad and extending to a region outside the imaging element, the imaging element being arranged on a front surface of the wiring substrate, and a sealing portion which is arranged adjacent to a side surface of the imaging element, which is a surface adjacent to a bottom surface of the imaging element, the sealing portion sealing the imaging element.

Further, in this first aspect, the imaging element may further include a protrusion arranged on the pad, and the wiring substrate may include the wiring connected to the pad via the protrusion.

Further, in this first aspect, the imaging element may further include an insulation film arranged on the bottom surface of the image pickup chip.

Further, in this first aspect, the imaging element having been sealed by the sealing portion may be arranged on the wiring substrate.

Further, in this first aspect, the sealing portion may perform the sealing of the imaging element having been arranged on the wiring substrate.

Further, in this first aspect, a connecting portion which is arranged on a back surface that is a surface different from the front surface of the wiring substrate, the connecting portion being connected to the wiring may further be provided.

Further, in this first aspect, a second semiconductor element arranged on the wiring substrate may further be provided, and the sealing portion may further seal a side surface of the second semiconductor element.

Still further, in this first aspect, the second semiconductor element may include a processing circuit that processes the output image signal.

Still further, in this first aspect, the second semiconductor element may include a second imaging element.

Still further, in this first aspect, a plurality of the second semiconductor elements may be arranged on the wiring substrate, and the sealing portion may further seal side surfaces of the plurality of the second semiconductor elements.

In addition, in this first aspect, the light transmitting portion may include glass.

In addition, in this first aspect, the light transmitting portion may include a resin.

In addition, a second aspect of the present disclosure is a method for manufacturing an imaging device, the method including a wiring substrate arranging step of arranging an imaging element on a front surface of a wiring substrate, the imaging element including an image pickup chip over which a light transmitting portion transmitting incident light is arranged and which generates an image signal on the basis of the incident light transmitted through the light transmitting portion and a pad which is arranged on a bottom surface that is a surface of the image pickup chip different from a surface on which the light transmitting portion is arranged, the pad transmitting the generated image signal, the wiring substrate having wiring connected to the pad and extending to a region outside the imaging element, and a sealing step of arranging a sealing member on a side surface of the imaging element, which is a surface adjacent to a bottom surface of the imaging element.

The adoption of the above aspects brings about an effect of extending the wiring layer of the wiring substrate connected to the pad of the image pickup chip of the imaging element to a region outside the imaging element in the imaging device. It is expected that the pad of the image pickup chip will be rearranged by the wiring layer.

DESCRIPTION OF EMBODIMENTS

Next, modes for carrying out the present disclosure (hereinafter referred to as embodiments) will be described with reference to the drawings. In the following drawings, the same or similar parts are designated by the same or similar reference signs. In addition, the embodiments will be described in the following order.
1. First Embodiment
2. Second Embodiment
3. Third Embodiment
4. Fourth Embodiment
5. Fifth Embodiment
6. Sixth Embodiment
7. Seventh Embodiment
8. Application Example to Camera

1. First Embodiment

[Configuration of Imaging Device]

Figure 1:
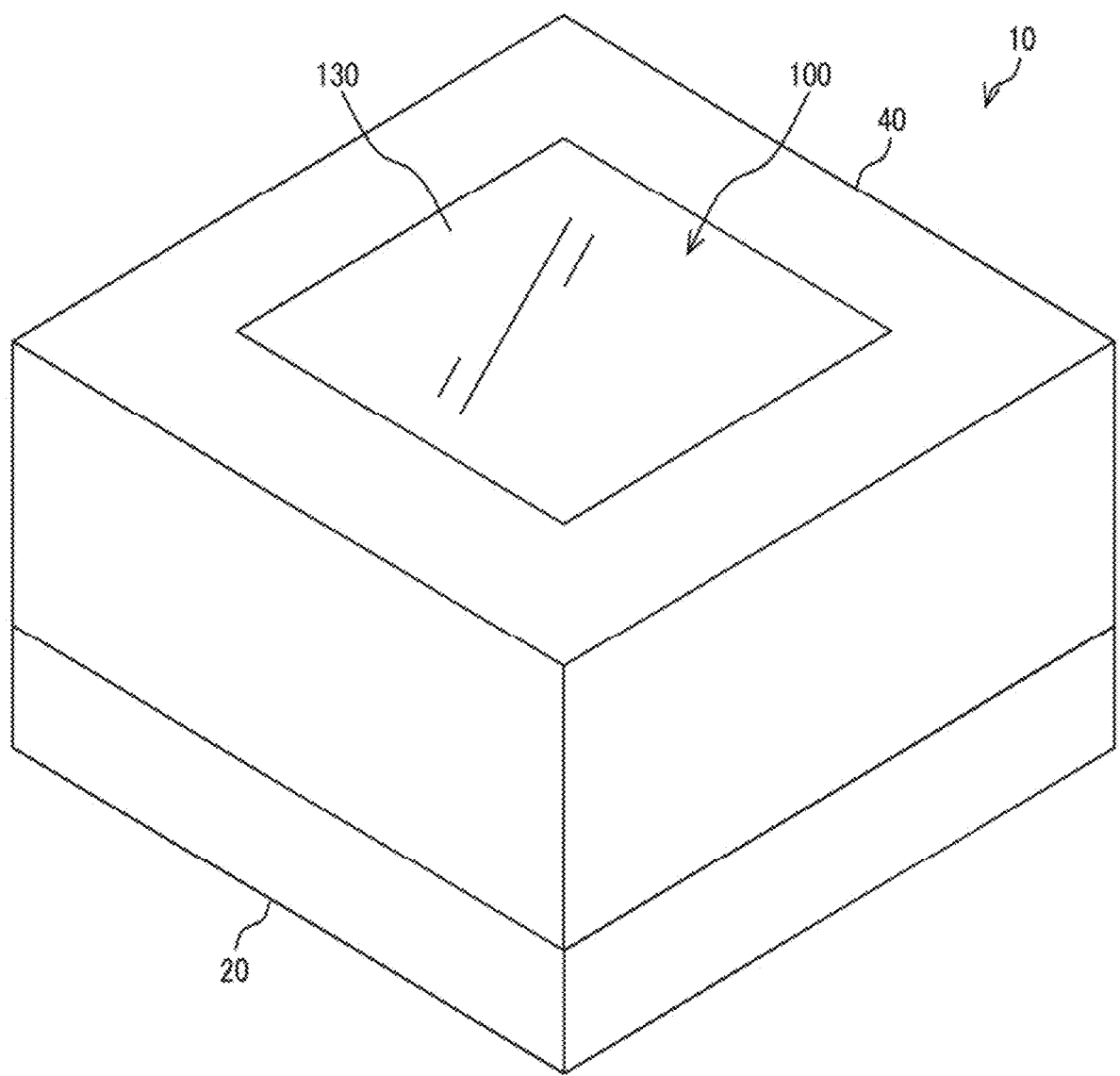
FIG. 1 is a diagram illustrating a configuration example of an imaging device according to an embodiment of the present disclosure.

FIG. 1 is a diagram illustrating a configuration example of an imaging device according to an embodiment of the present disclosure. The figure is a perspective view illustrating a configuration example of an imaging device 10. The imaging device 10 in the figure is configured by being enclosed in a semiconductor package including an imaging element 100. The imaging element 100 is a semiconductor element that generates an image signal on the basis of incident light. A light transmitting portion 130 that transmits the incident light is arranged on a light receiving surface that is a surface irradiated with the incident light. The imaging element 100 is mounted on a wiring substrate 20, and a side surface of the imaging element 100 is sealed with a sealing portion 40.

[Structure of Cross Section of Imaging Device]

Figure 2:
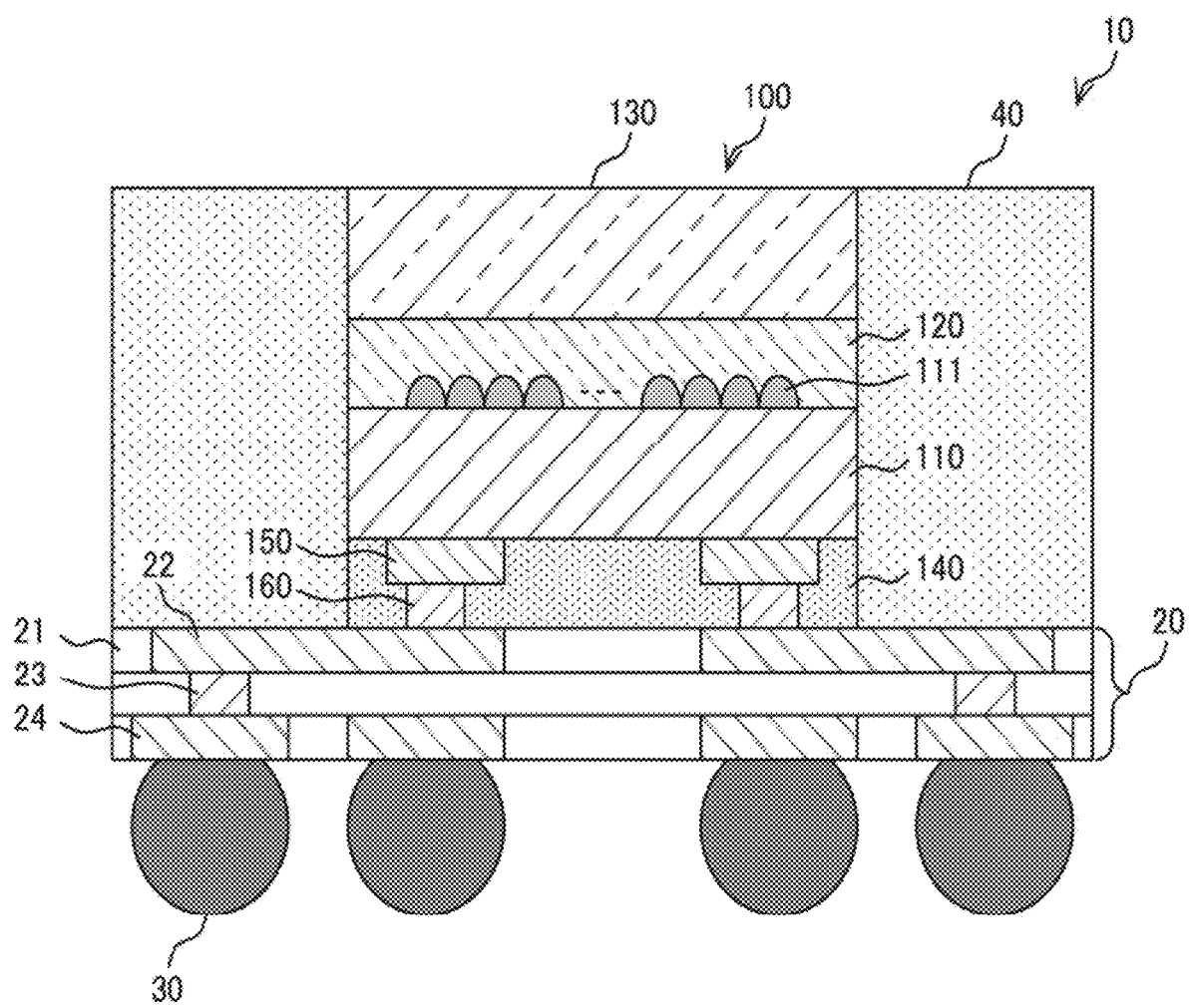
FIG. 2 is a cross-sectional view illustrating a configuration example of an imaging device according to a first embodiment of the present disclosure.

FIG. 2 is a cross-sectional view illustrating a configuration example of the imaging device according to the first embodiment of the present disclosure. The imaging device 10 in the figure includes the imaging element 100, the wiring substrate 20, the sealing portion 40, and a connecting portion 30.

As described above, the imaging element 100 is a semiconductor element that generates an image signal on the basis of incident light, and is provided with an image pickup chip 110, the light transmitting portion 130, an adhesive 120, pads 150, bumps 160, and an insulation film 140.

The image pickup chip 110 is a semiconductor substrate on which a plurality of pixels (pixels 102 to be described later) that generates image signals on the basis of incident light is arranged. The image pickup chip 110 can include silicon (Si), for example. An on-chip lens 111 that collects incident light is arranged for each pixel. In the figure, the on-chip lenses 111 arranged for respective pixels on a surface of the image pickup chip 110 are illustrated. In addition to the pixels, a processing circuit for processing an image signal, and the like are arranged on the image pickup chip 110. The details of the configurations of the pixels and the processing circuit will be described later.

The light transmitting portion 130 is a substrate that transmits incident light. Further, the light transmitting portion 130 further protects the image pickup chip 110. This light transmitting portion 130 can include such a transparent member as glass or a resin.

The adhesive 120 is used to bond the light transmitting portion 130 to the light receiving surface side of the image pickup chip 110. A transparent resin can be used for the adhesive 120.

The pad 150 is an electrode arranged on a bottom surface which is a surface different from the light receiving surface of the image pickup chip 110. The image signal generated by the pixels is output to the pad 150. Control signals other than the image signal, power supplies, and the like are also transmitted via the pad 150. A plurality of such pads 150 is arranged on the bottom surface of the image pickup chip 110 to form input/output terminals of the image pickup chip 110. The pad 150 can include a metal such as copper (Cu).

The bump 160 is a columnar protrusion arranged on the pad 150. The pad 150 and a wiring layer 22 of the wiring substrate 20 to be described later are connected via the bump 160. The bump 160 can include a metal such as Cu or gold (Au). Further, the bump 160 can also be configured by soldering. In addition, the bump 160 can be formed by plating or the like, for example. Note that a shape and the like of the bump 160 can be changed according to a pitch at which the bumps 160 are arranged. Incidentally, the bump 160 is an example of a protrusion described in the claims.

The insulation film 140 insulates the bottom surface of the image pickup chip 110. This insulation film 140 has a shape covering side surfaces of the pads 150 and protects the bottom surface of the image pickup chip 110 and the pads 150. The insulation film 140 in the figure has a shape covering side surfaces of the bumps 160, and further protects the bumps 160 as well. The insulation film 140 can include a resin such as solder resist, for example. Further, the insulation film 140 can also include an inorganic material such as silicon dioxide ($SiO_2$) or silicon nitride (SiN).

The wiring substrate 20 is a substrate having the imaging element 100 mounted on a front surface thereof. The wiring substrate 20 includes the wiring layer 22 and an insulation layer 21. The wiring layer 22 is wiring for transmitting a signal of the imaging element 100. The wiring layer 22 in the figure is connected to the pad 150 via the bump 160 of the imaging element 100 and has a shape extending to a region outside the imaging element 100. The wiring layer 22 can include a metal such as Cu, Au, nickel (Ni), chromium (Cr), and palladium (Pd). The insulation layer 21 insulates the wiring layer 22. The insulation layer 21 can include an epoxy resin, a polyimide resin, an acrylic resin, a phenol resin, or the like, for example. The wiring layer 22 and the insulation layer 21 can be configured in multiple layers. The wiring layers 22 arranged in different layers are connected by a via 23. The via 23 can include a columnar metal or the like. Incidentally, a wiring substrate pad 24 is arranged on the back surface of the wiring substrate 20. The wiring substrate pad 24 is connected to the pad 150 of the imaging element 100 via the wiring layer 22 and the via 23. Further, the connecting portion 30 to be described later is joined to the wiring substrate pad 24.

The sealing portion 40 seals the imaging element 100. The sealing portion 40 in the figure is arranged adjacent to the side surface of the imaging element 100, and seals the side surface of the imaging element. Further, the sealing portion 40 is also arranged adjacent to a region of the wiring substrate 20 outside a region where the imaging element 100 is placed. The sealing portion 40 can include an epoxy resin, a polyimide resin, or the like. Further, in order to improve a strength of the sealing portion 40, a filler can also be dispersed in these resins. It is to be noted that a material having a low coefficient of thermal expansion is preferably used for the sealing portion 40. This is because a warp of the wiring substrate 20 after sealing can be reduced.

The connecting portions 30 are arranged on the back surface, which is a surface of the wiring substrate 20 different from the surface on which the imaging element 100 is arranged, and are connected to the wiring layer. The connecting portions 30 in the figure are connected to the wiring substrate pads 24. This connecting portion 30 constitutes a terminal of the imaging device 10 and can include a metal such as a solder ball.

The wiring substrate 20 is arranged adjacent to the bottom surfaces of the imaging element 100 and the sealing portion 40. The wiring layer 22 and the via 23 connect the pad 150 of the imaging element 100 and the wiring substrate pad 24. A part of the wiring substrate pad 24 is arranged in a region outside the imaging element 100. That is, the position of the pad 150 of the imaging element 100 is rearranged in a shape extended to the region of the sealing portion 40. Such a package is called an FOWLP and is a package that can be applied to a semiconductor chip having many pads as compared with a CSP. The imaging device 10 in the figure is a package in which the imaging element 100 is enclosed in the FOWLP and the side surfaces other than the light receiving surface are sealed by the sealing portion 40. Imaging can be performed without being hindered by the sealing portion 40.

Incidentally, a chip component (not illustrated) such as a capacitor can be arranged on the back surface of the wiring substrate 20. To be specific, the chip component can be mounted by soldering to the wiring substrate pad 24 on which the connecting portion 30 is not arranged.

[Manufacturing Method of Imaging Device]

FIGS. 3A, 3B, 3C, 4A, 4B, 4C, 5A, 5B, 6A, and 6B are diagrams illustrating an example of a method for manufacturing an imaging device according to the first embodiment of the present disclosure. FIGS. 3A, 3B, 3C, 4A, 4B, 4C, 5A, 5B, 6A, and 6B are diagrams illustrating an example of a manufacturing process of the imaging device 10.

Figure 3:
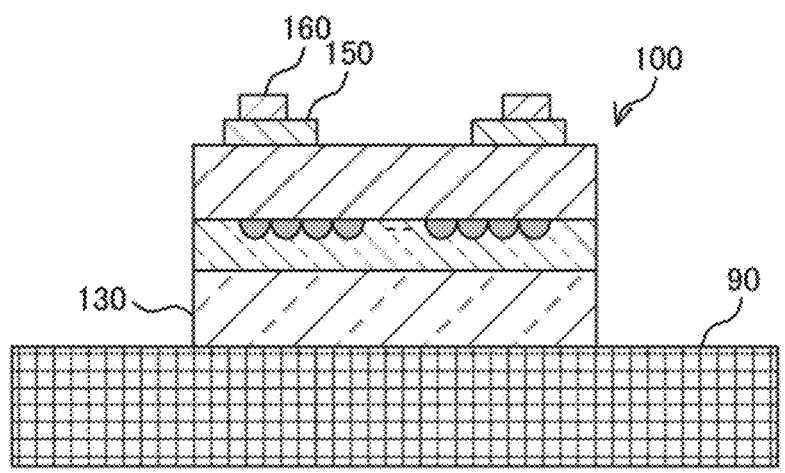
FIGS. 3A, 3B, and 3C depict diagrams illustrating an example of a method for manufacturing the imaging device according to the first embodiment of the present disclosure.
Figure 3:
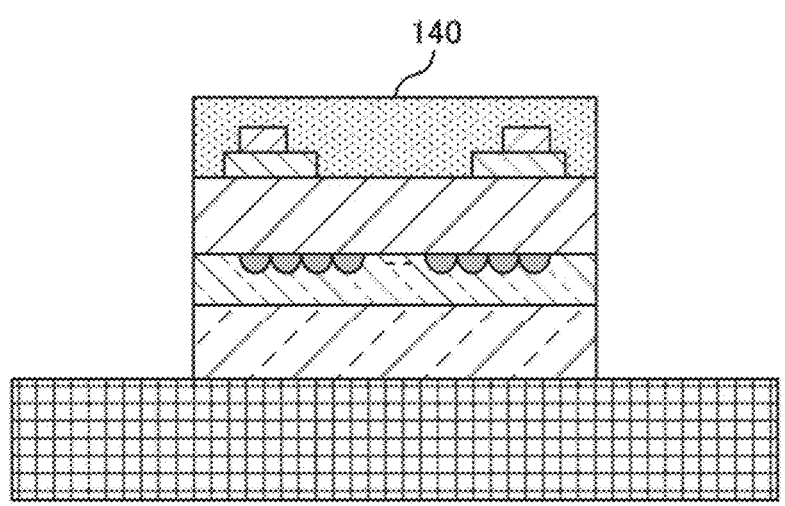
Figure 3:
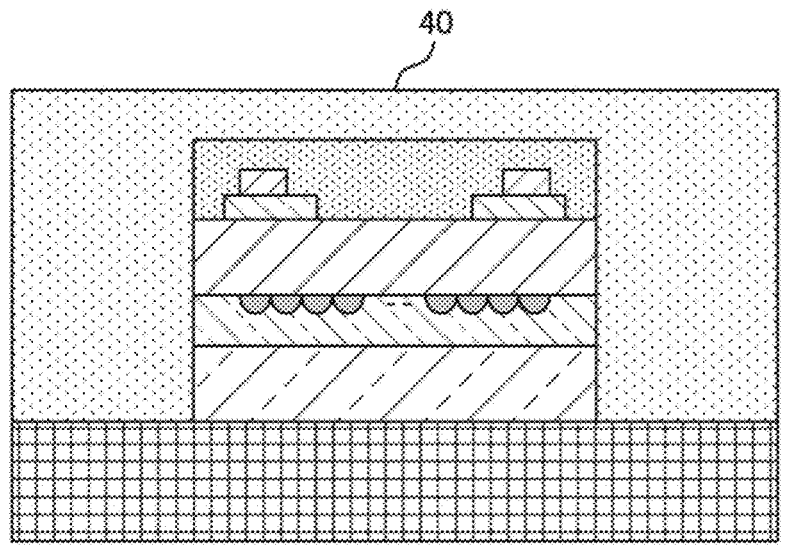

First, the imaging element 100 is fixed to a support substrate 90. Here, the support substrate 90 is a substrate for supporting members in the manufacturing process of the imaging device 10. For the support substrate 90, a glass plate or a semiconductor wafer can be used, for example. The light transmitting portion 130 side of the imaging element 100 is placed and fixed on the support substrate 90. An adhesive (not illustrated) can be used for this fixation (FIG. 3A).

Next, the insulation film 140 is arranged on the bottom surface of the imaging element 100. This can be carried out, for example, by applying the liquid material of the insulation film 140 (FIG. 3B).

Next, the sealing portion 40 is arranged. This can be carried out, for example, by disposing the sealing portion 40 in liquid form by a coating method or a screen printing method and curing the sealing portion 40. Further, for example, the sealing portion 40 can be formed by a molding method using a mold (FIG. 3C). This process corresponds to a sealing step.

Figure 4:
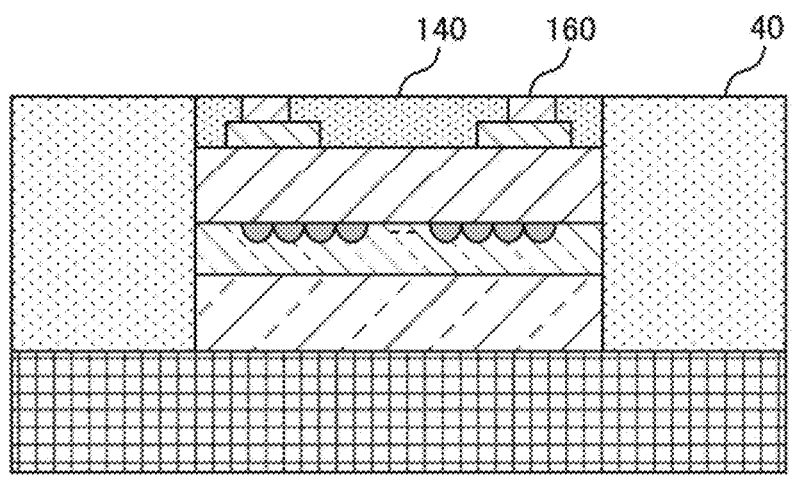
FIGS. 4A, 4B, and 4C depict diagrams illustrating an example of the method for manufacturing the imaging device according to the first embodiment of the present disclosure.
Figure 4:
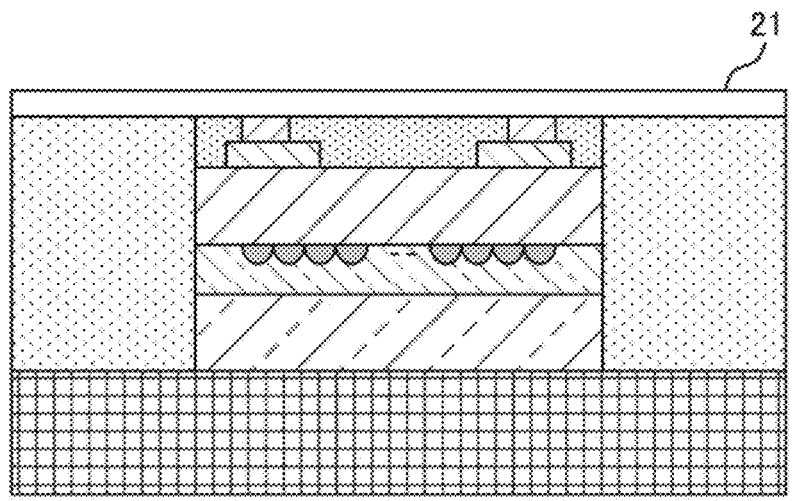
Figure 4:
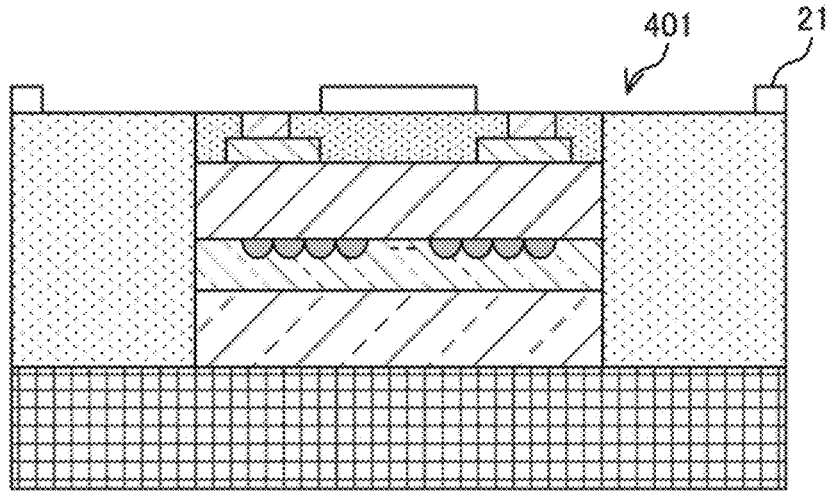

Next, the surface of the sealing portion 40 is ground, and at the same time the surface of the insulation film 140 is ground, so that the bump 160 is exposed (FIG. 4A).

Figure 5:
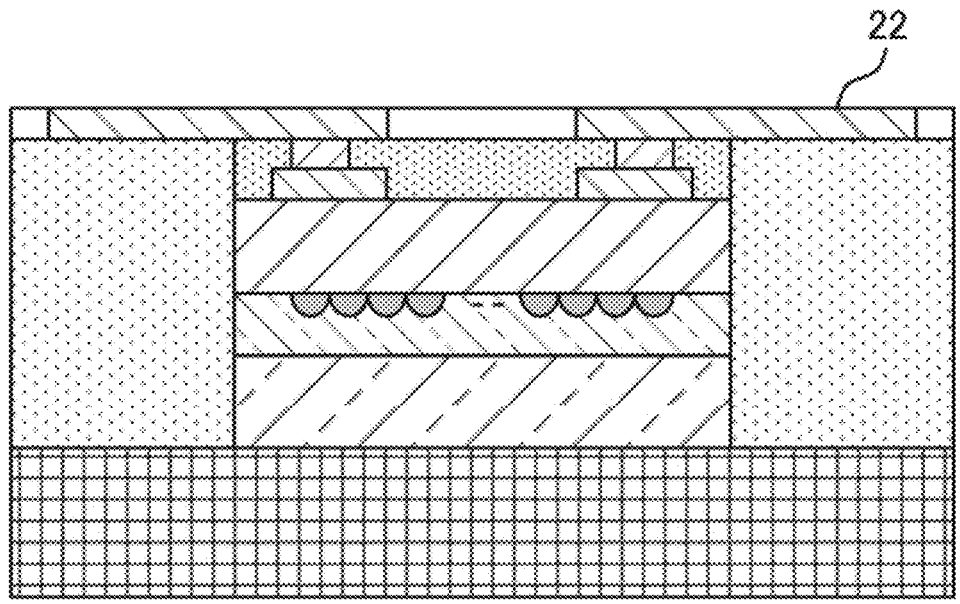
FIGS. 5A and 5B depict diagrams illustrating an example of the method for manufacturing the imaging device according to the first embodiment of the present disclosure.
Figure 5:
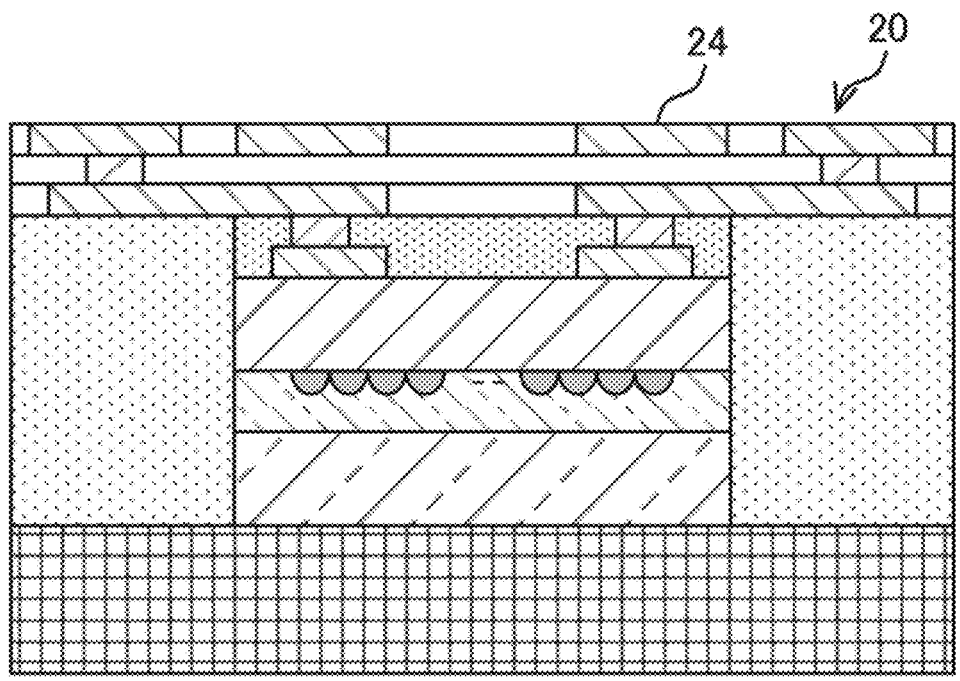

Next, the insulation layer 21 is arranged on the surfaces of the insulation film 140 and the sealing portion 40. This can be done, for example, by applying a material film of the insulation layer 21 (FIG. 4B). Next, an opening 401 is formed in the region of the insulation layer 21 where the wiring layer 22 is arranged. This can be formed by forming a resist by photolithography and performing etching with this resist as a mask. Note that, in a case where the photosensitive resist is applied to the insulation layer 21, the opening 401 can be formed by performing exposure and development after forming the insulation layer 21. (FIG. 4C). Next, a metal or the like that is a material for the wiring layer 22 is arranged in the opening 401 (FIG. 5A). This can be formed by a plating method, for example. To be specific, this can be formed by sequentially stacking a barrier layer including Ti or the like and a seed layer including Cu or the like on the surface of the insulation layer 21 by sputtering or the like, so that a mask of a resist formed by photolithography is placed and a Cu layer can be formed by plating. As a result, the wiring layer 22 can be connected to the pad 150 of the imaging element 100 via the bump 160. The formation of the insulation layer 21 and the wiring layer 22 is repeated as many times as necessary. Incidentally, the wiring substrate pad 24 is formed on the back surface of the wiring substrate 20 by a similar process to that of the wiring layer 22. Thereby, the wiring substrate 20 can be arranged (FIG. 5B). This process corresponds to the wiring substrate arrangement step.

Next, the connecting portions 30 are each arranged on the wiring substrate pad 24 of the wiring substrate 20. This can be carried out, for example, by placing the connecting portion 30 made as a solder ball on the wiring substrate pad 24 coated with flux, and heating and melting the solder ball with a reflow furnace or the like (FIG. 6A).

Figure 6:
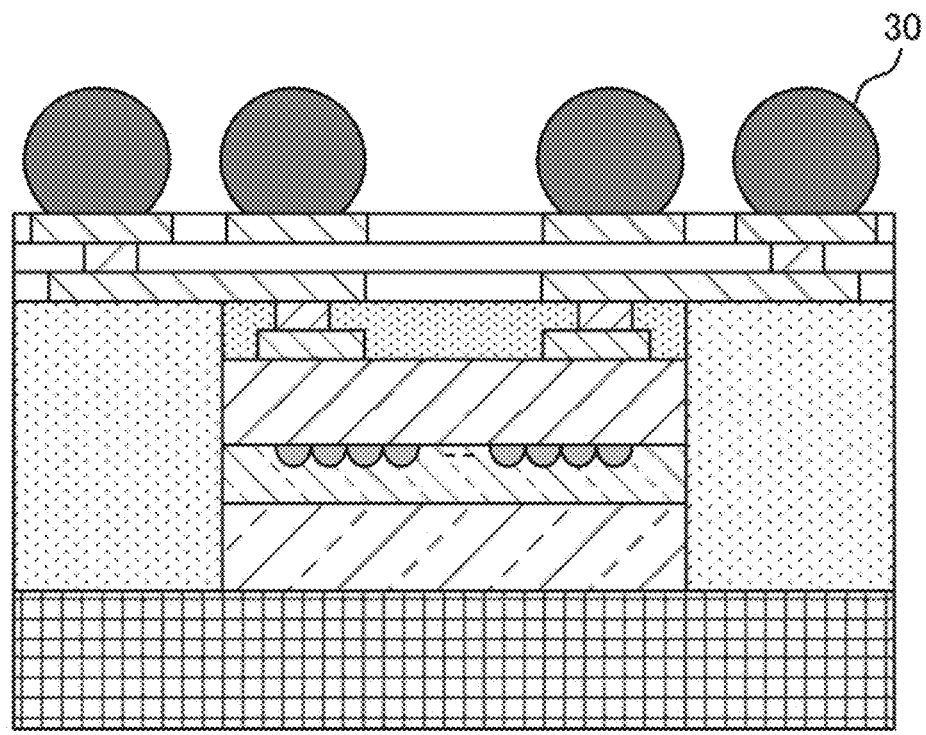
FIGS. 6A and 6B depict diagrams illustrating an example of the method for manufacturing the imaging device according to the first embodiment of the present disclosure.
Figure 6:
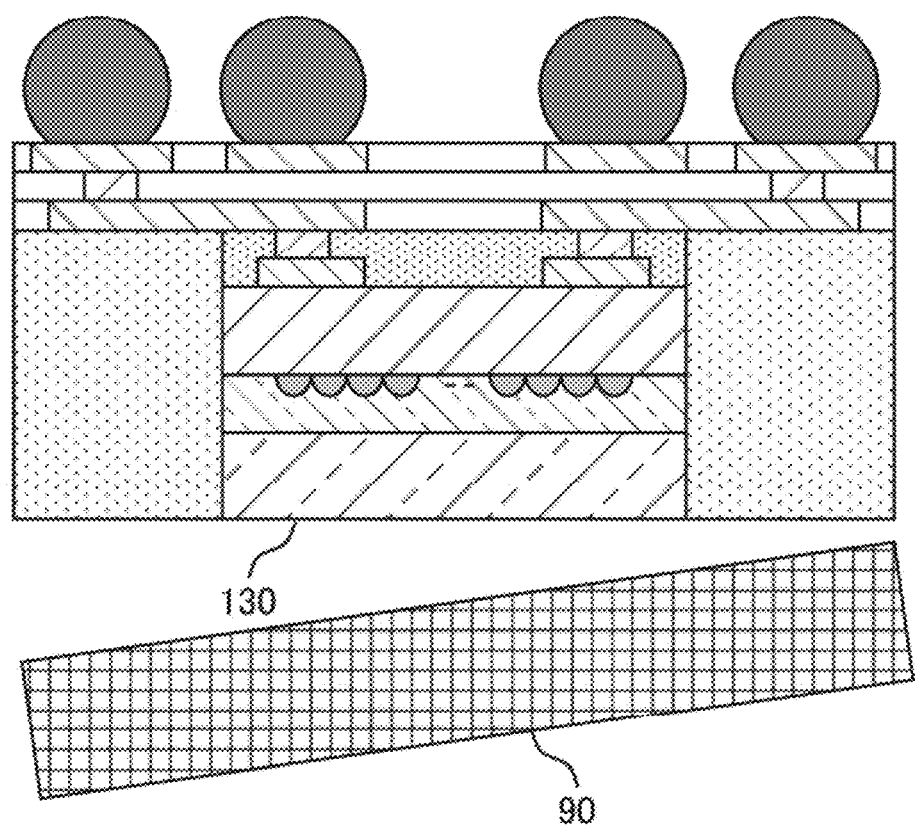

Next, the support substrate 90 is removed, and the adhesive is removed, so that the surface of the light transmitting portion 130 of the imaging element 100 is exposed (FIG. 6B). By the above steps, the imaging device 10 can be manufactured.

By adopting such a manufacturing method, the light transmitting portion 130 of the imaging element 100 can be protected by the support substrate 90. Further, by arranging the bump 160 connecting the pad 150 of the imaging element 100 and the wiring layer 22 of the wiring substrate 20 on the imaging element 100 side, the wafer process can be used for the formation of the bump 160. The bump 160 can be easily formed as compared with a case where the bump is formed on the wiring substrate 20 side. Further, by arranging the insulation film 140 on the bottom surface of the image pickup chip 110, the bump 160 can be protected in the manufacturing process.

It should be noted that the manufacturing method of the imaging device is not limited to this example. For example, when the bump 160 is formed by plating, the bump 160 can be formed after the insulation film 140 is arranged on the bottom surface of the imaging element 100. Specifically, FIG. 3B, an opening is formed in the region of the insulation film 140 where the bump 160 is to be formed, and the bump 160 can be formed by embedding Cu formed by plating in the opening.

Modification Example

In the imaging element 100 described above, the adhesive 120 is arranged on the entire surface of the light receiving surface of the image pickup chip 110, but the imaging element 100 having another configuration may be used.

[Other Configurations of Imaging Device]

Figure 7:
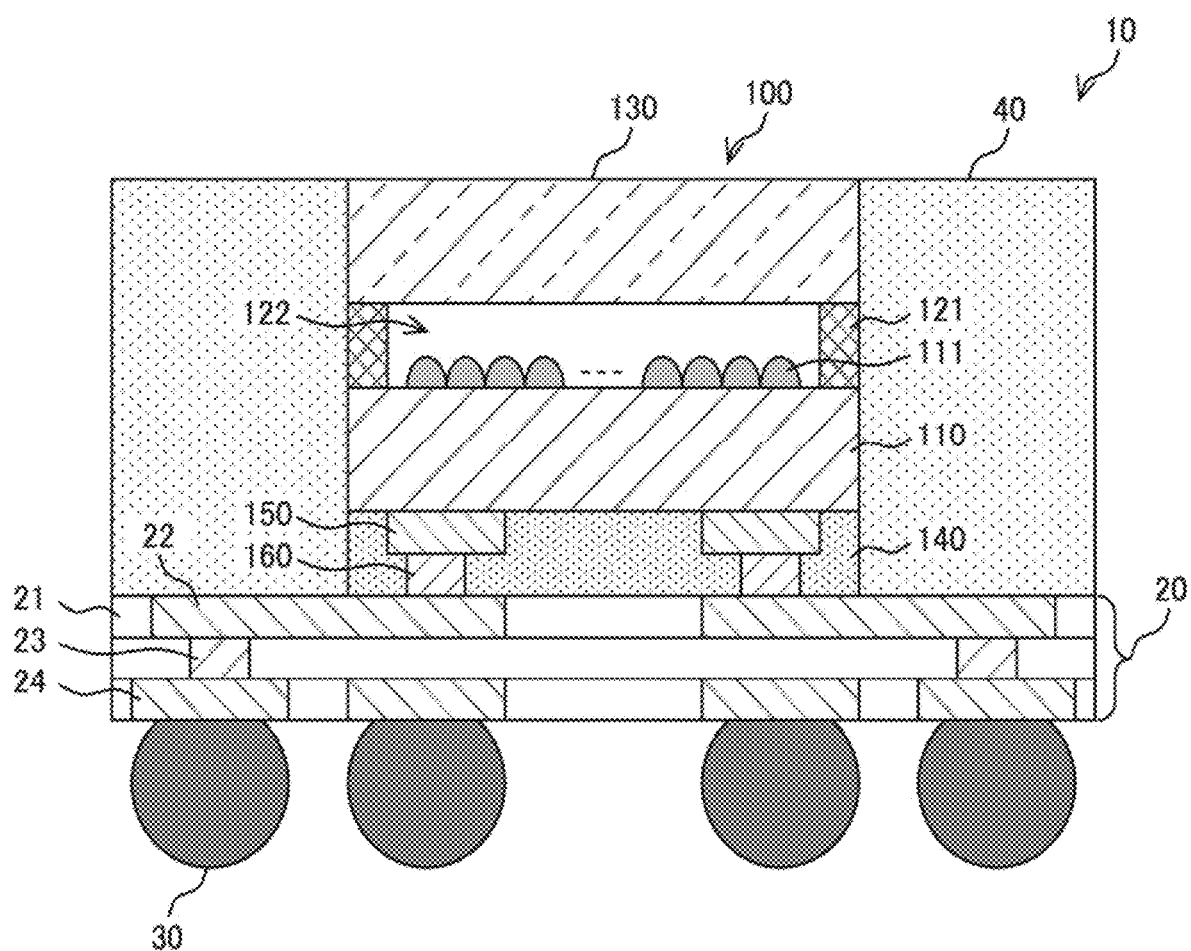
FIG. 7 is a cross-sectional view illustrating another configuration example of the imaging device according to the first embodiment of the present disclosure.

FIG. 7 is a cross-sectional view illustrating another configuration example of the imaging device according to the first embodiment of the present disclosure. The imaging device 10 in the figure is different from the imaging device 10 in FIG. 2 in that a spacer 121 is arranged instead of the adhesive 120 of the imaging element 100.

The spacer 121 is arranged between the image pickup chip 110 and the light transmitting portion 130 to form a gap 122. The imaging device 10 of the figure is configured so that the spacer 121 and the sealing portion 40 are in contact with each other.

As described above, the imaging device 10 of the first embodiment of the present disclosure can constitute a FOWLP in which the light receiving surface of the imaging element 100 is exposed by arranging the sealing portion 40 on the side surface of the imaging element 100. The signal can be taken out from the imaging element 100 by soldering or the like via the connecting portion 30 on the back surface of the imaging device 10, and the mounting of the imaging device 10 can be simplified.

2. Second Embodiment

In the imaging device 10 of the first embodiment described above, the wiring substrate 20 is arranged on the imaging element 100 obtained after being sealed by the sealing portion 40 in the manufacturing process. On the other hand, the imaging device 10 of the second embodiment of the present disclosure is different from that of the above-mentioned first embodiment in that the imaging element 100 is first arranged on the wiring substrate 20 and then sealed by the sealing portion 40.

Figure 8:
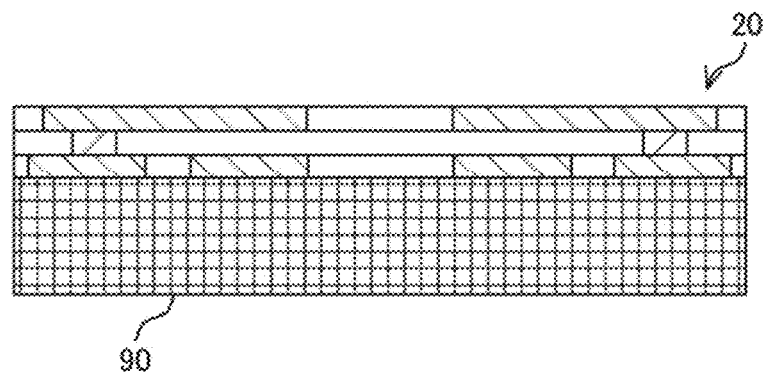
FIGS. 8A, 8B, and 8C depict diagrams illustrating an example of the method for manufacturing an imaging device according to a second embodiment of the present disclosure.
Figure 8:
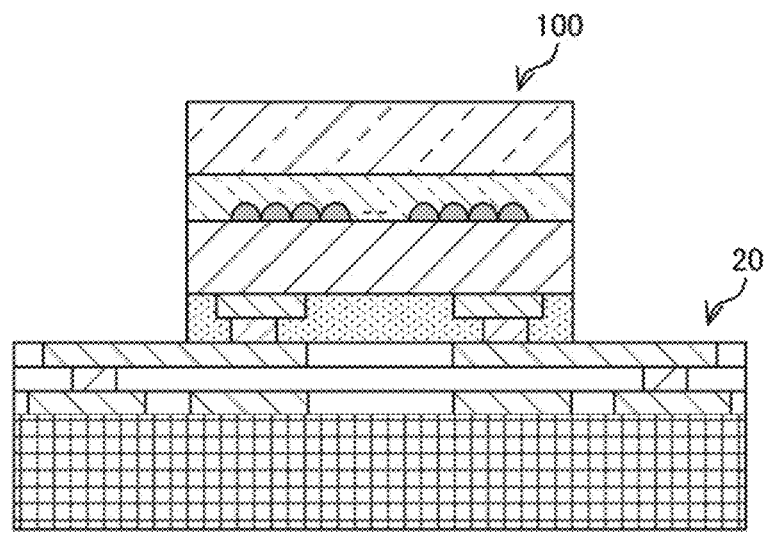
Figure 8:
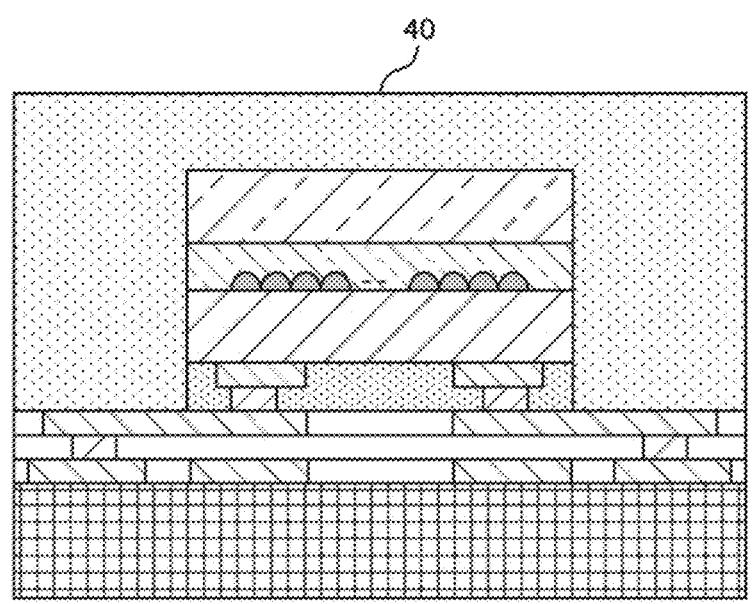

[Manufacturing Method of Imaging Device] FIGS. 8A, 8B, 8C, 9A, 9B, 10A, and 10B are diagrams illustrating an example of a method for manufacturing an imaging device according to a second embodiment of the present disclosure. FIGS. 8A, 8B. 8C, 9A, 9B, 10A, and 10B are diagrams illustrating an example of the manufacturing process of the imaging device 10, similarly to FIGS. 3A, 3B, 3C, 4A, 4B, 4C, 5A, 5B, 6A, and 6B. The manufacturing process differs from that of FIGS. 3A, 3B, 3C, 4A, 4B, 4C, 5A, 5B, 6A, and 6B in that the wiring substrate arrangement process is executed before the sealing process.

First, the wiring substrate 20 is arranged on the support substrate 90. This can be done by applying an adhesive (not illustrated) to the support substrate 90 and bonding the wiring substrate 20 to the support substrate 90 (FIG. 8A).

Next, the imaging element 100 is arranged on the wiring substrate 20. To be specific, the imaging element 100 is placed by aligning the position of the bump 160 of the imaging element 100 with the wiring layer 22 of the wiring substrate 20 and joined thereto. This joining can be done, for example, by soldering. In addition, for example, the imaging element 100 can also be heated and pressed against the wiring substrate 20 to directly bond the metals of the wiring layer 22 and the bump 160 to each other (FIG. 8B). This process corresponds to the wiring substrate arrangement step.

Next, the sealing portion 40 is arranged around the imaging element 100 (FIG. 8C). This process corresponds to a sealing step.

Figure 9:
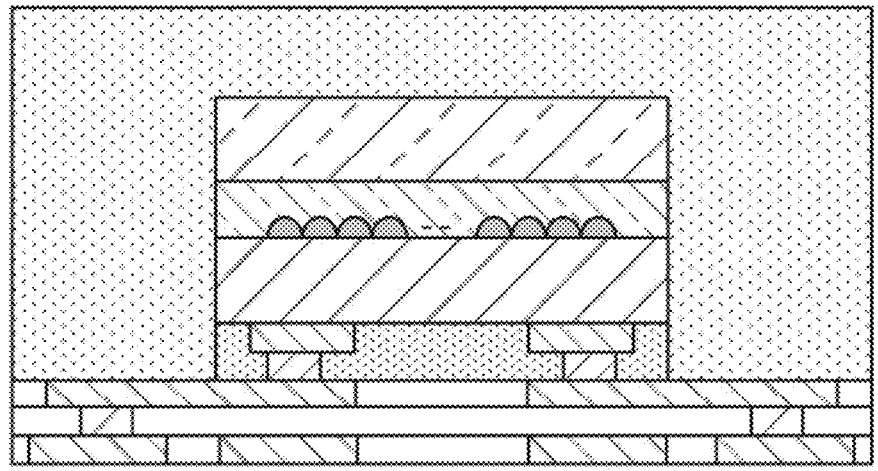
FIGS. 9A and 9B depict diagrams illustrating an example of the method for manufacturing the imaging device according to the second embodiment of the present disclosure.
Figure 9:
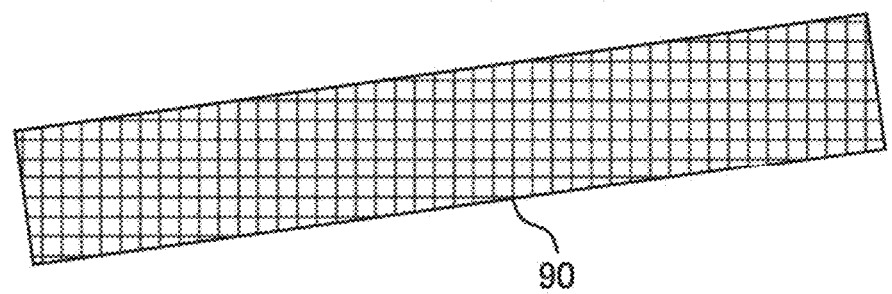
Figure 9:
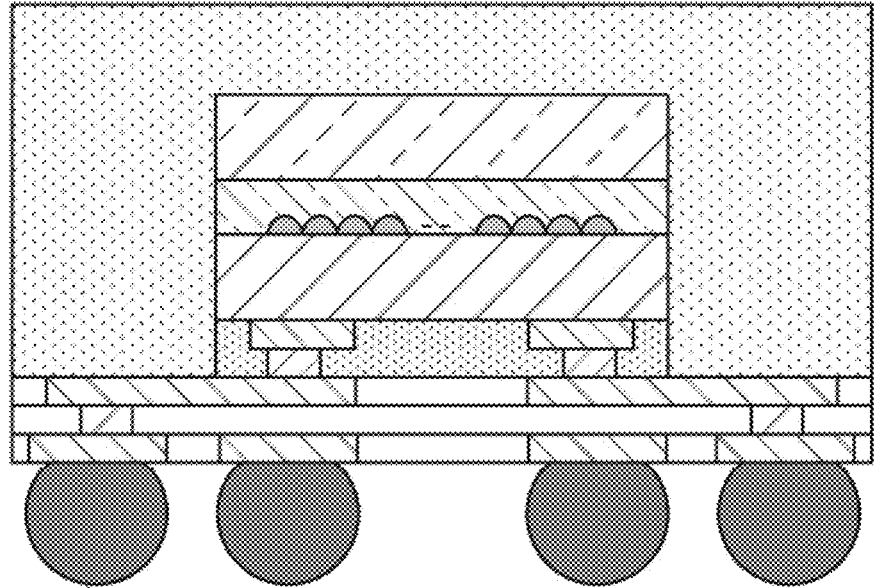

Next, the support substrate 90 is removed, and the adhesive on the back surface of the wiring substrate 20 is removed (FIG. 9A).

Then, the connecting portion 30 is arranged by soldering on the wiring substrate pad 24 of the wiring substrate 20 (FIG. 9B).

Figure 10:
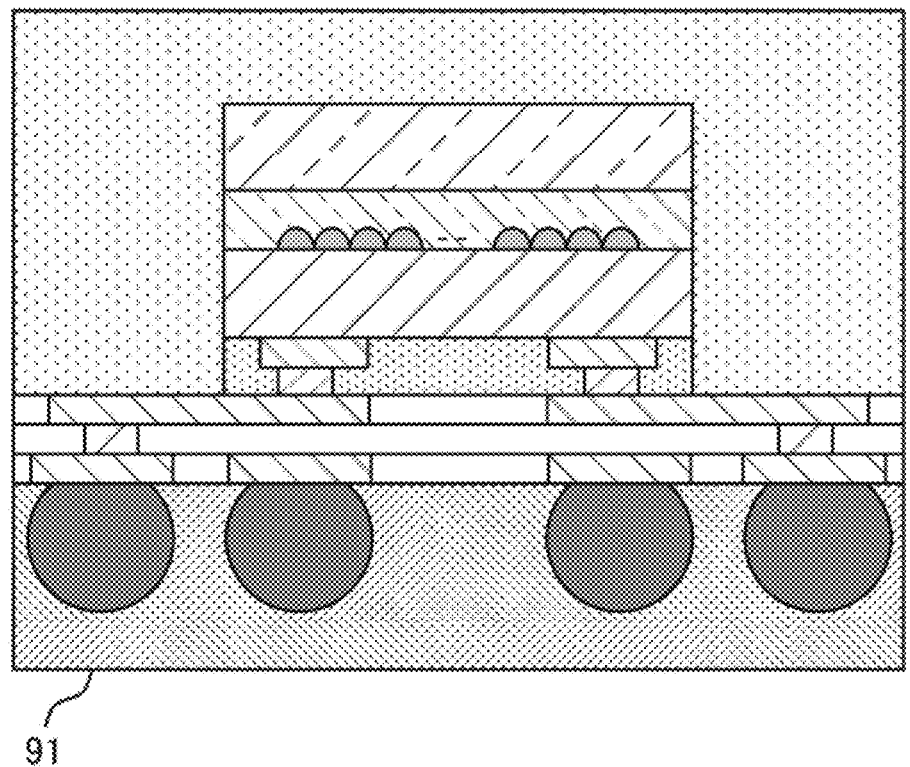
FIGS. 10A and 10B depict diagrams illustrating an example of the method for manufacturing the imaging device according to the second embodiment of the present disclosure.
Figure 10:
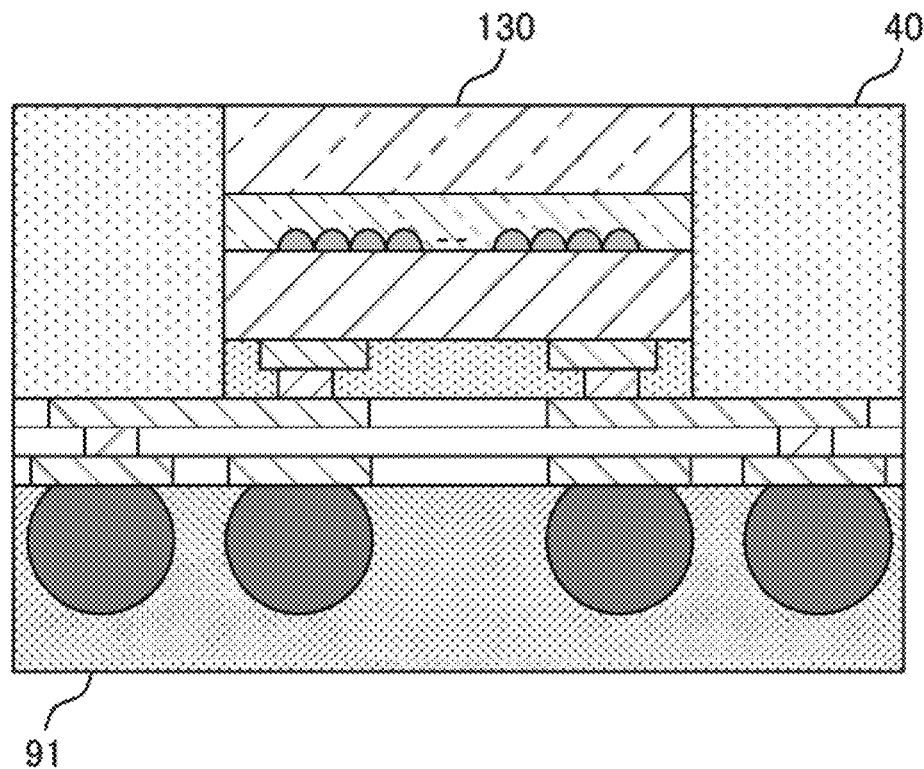

Next, a back grinding tape 91 is adhered to the back surface of the wiring substrate 20 (FIG. 10A). This back grinding tape 91 is an adhesive tape that protects bumps and the like in the manufacturing process of a semiconductor element.

Then, the sealing portion 40 is ground, so that the light transmitting portion 130 of the imaging element 100 is exposed (FIG. 10B). Incidentally, at this time, the height of the imaging device 10 can also be reduced by grinding the light transmitting portion 130 together with the sealing portion 40. After that, the back grinding tape 91 is peeled off.

The imaging device 10 can be manufactured by the above manufacturing processes. Since the sealing portion 40 arranged so as to cover the imaging element 100 is ground such that the light transmitting portion 130 is exposed, the light receiving surface of the imaging element 100 can be protected by the sealing portion 40. In the manufacturing method described above, the number of steps is increased as compared with the manufacturing method of FIGS. 3A, 3B, 3C, 4A, 4B, 4C, 5A, 5B, 6A, and 6B. However, since the semiconductor element such as the imaging element 100 is arranged on the wiring substrate 20 in what is generally called face-down manner, a plurality of semiconductor elements having different thicknesses can be arranged in a package.

Incidentally, the manufacturing method of the imaging device 10 is not limited to this example. For example, the process of removing the support substrate 90 after grinding the sealing portion 40 and then arranging the connecting portions 30 can also be performed without using the back grinding tape 91.

Since the configuration of the imaging device 10 other than this is similar to that of the imaging device 10 described in the first embodiment of the present disclosure, the description thereof will be omitted.

As described above, the imaging device 10 of the second embodiment of the present disclosure is manufactured by executing the wiring substrate arrangement process before the sealing process. A plurality of imaging elements and the like having different thicknesses can be housed in one package.

3. Third Embodiment

Figure 11:
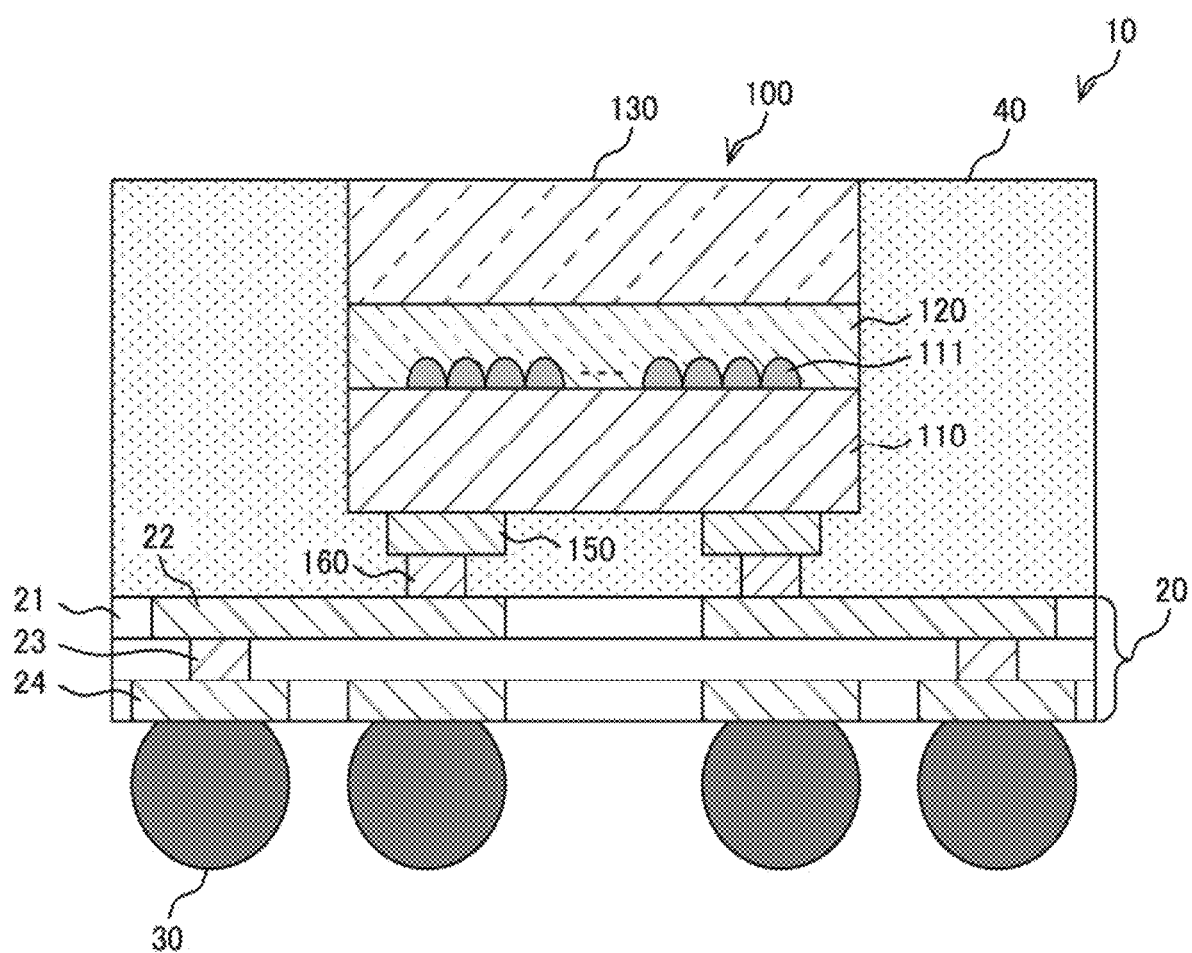
FIG. 11 is a cross-sectional view illustrating a configuration example of an imaging device according to a third embodiment of the present disclosure.

In the imaging device 10 of the first embodiment described above, the insulation film 140 is arranged on the bottom surface of the imaging element 100. On the other hand, the imaging device 10 of the third embodiment of the present disclosure is different from the above-mentioned first embodiment in that the insulation film 140 is omitted.
[Structure of Cross Section of Imaging Device]
FIG. 11 is a cross-sectional view illustrating a configuration example of the imaging device according to the third embodiment of the present disclosure. The figure is a diagram illustrating a configuration example of the imaging device 10 as in FIG. 2. The imaging device 10 differs from that in FIG. 2 in that the insulation film 140 is omitted.

As described above, the insulation film 140 is not arranged on the imaging element 100 in the figure, and the sealing portion 40 is arranged between the imaging element 100 and the wiring substrate 20. At a time of manufacturing the imaging device 10 of the figure, the sealing portion 40 is also arranged around the pads 150 and the bumps 160 in the sealing process described with reference to FIG. 3C.

Since the configuration of the imaging device 10 other than this is similar to that of the imaging device 10 described in the first embodiment of the present disclosure, the description thereof will be omitted.

As described above, regarding the imaging device 10 of the third embodiment of the present disclosure, the configuration of the imaging device 10 can be simplified by omitting the insulation film 140.

4. Fourth Embodiment

Figure 12:
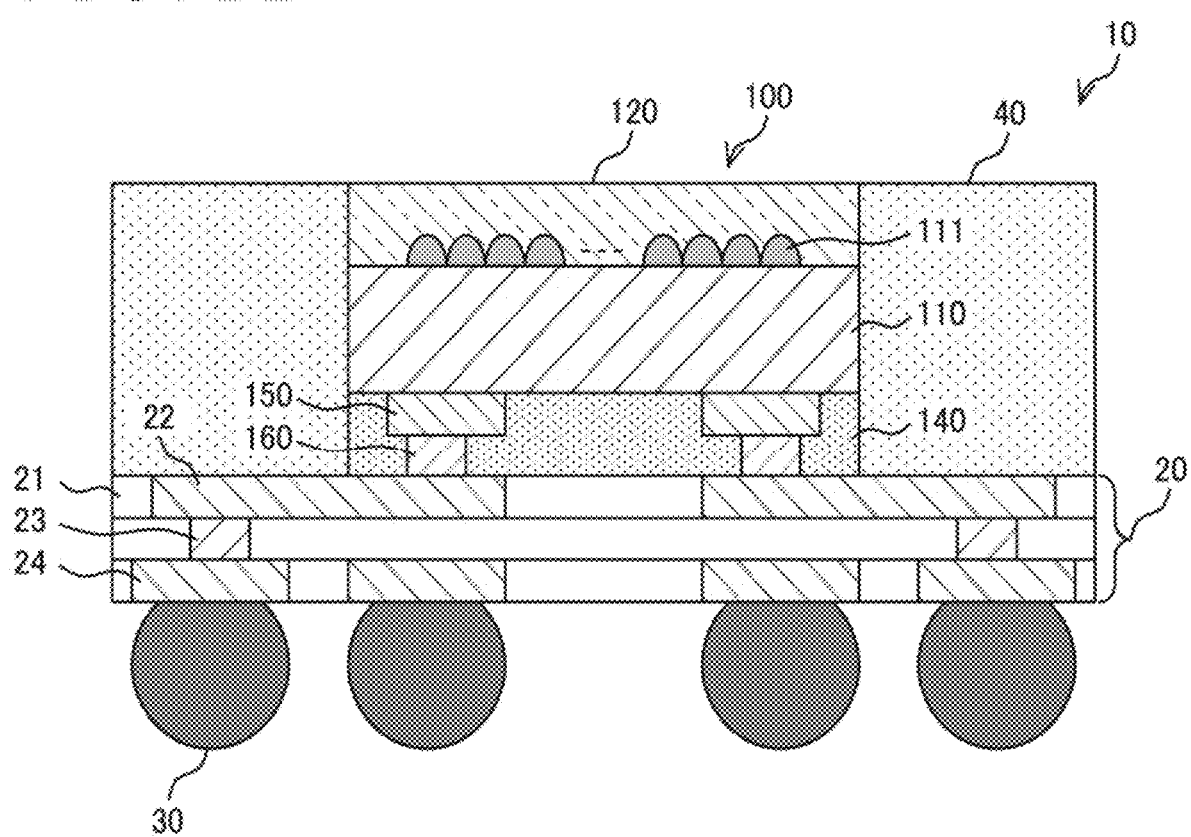
FIG. 12 is a cross-sectional view illustrating a configuration example of an imaging device according to a fourth embodiment of the present disclosure.

In the imaging device 10 of the first embodiment described above, the light transmitting portion 130 is arranged on the light receiving surface of the imaging element 100. On the other hand, the imaging device 10 of the fourth embodiment of the present disclosure is different from that of the above-mentioned first embodiment in that the light transmitting portion 130 is omitted.
[Structure of Cross Section of Imaging Device]
FIG. 12 is a cross-sectional view illustrating a configuration example of the imaging device according to the fourth embodiment of the present disclosure. The figure is a diagram illustrating a configuration example of the imaging device 10 as in FIG. 2. The configuration differs from that of the imaging device 10 of FIG. 2 in that the light transmitting portion 130 is omitted.

As described above, the light transmitting portion 130 is not arranged in the imaging element 100 in the figure, and only the resin layer constituting the adhesive 120 is arranged on the light receiving surface side of the imaging element 100. Therefore, the configuration of the imaging device 10 can be simplified, and the height of the imaging device 10 can be reduced. Note that the adhesive 120 is an example of the light transmitting portion described in the claims.

Since the configuration of the imaging device 10 other than this is similar to the configuration of the imaging device 10 described in the first embodiment of the present disclosure, the description thereof will be omitted.

As described above, regarding the imaging device 10 of the fourth embodiment of the present disclosure, the configuration of the imaging device 10 can be simplified by omitting the light transmitting portion 130.

5. Fifth Embodiment

Figure 13:
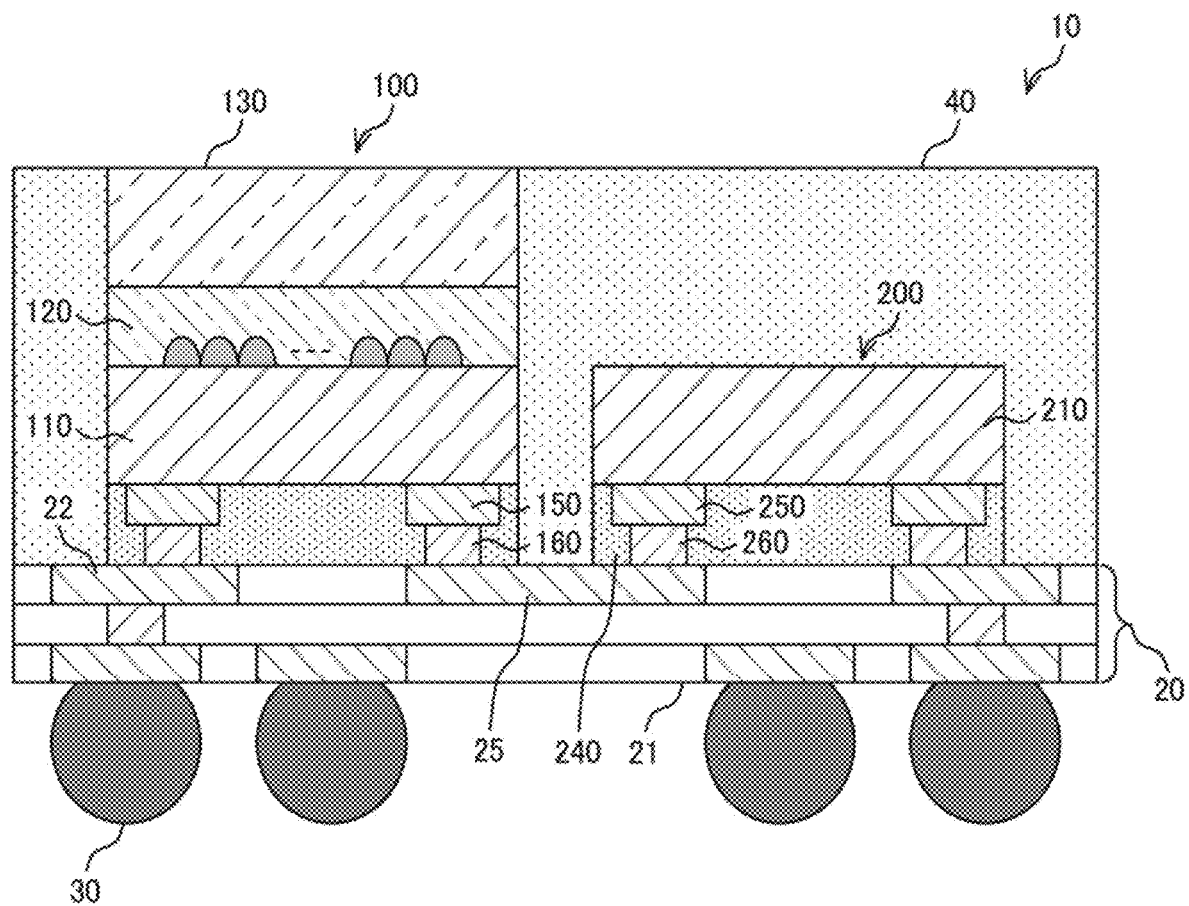
FIG. 13 is a cross-sectional view illustrating a configuration example of an imaging device according to a fifth embodiment of the present disclosure.

In the imaging device 10 of the first embodiment described above, only the imaging element 100 is enclosed in a package. On the other hand, the imaging device 10 of the fifth embodiment of the present disclosure is different from that of the above-mentioned first embodiment in that a plurality of semiconductor elements is enclosed in a package.
[Structure of Cross Section of Imaging Device]
FIG. 13 is a cross-sectional view illustrating a configuration example of the imaging device according to the fifth embodiment of the present disclosure. The figure is a diagram illustrating a configuration example of the imaging device 10 as in FIG. 2. The imaging device 10 differs from that of FIG. 2 in that a semiconductor element 200 is further arranged.

The semiconductor element 200 is a semiconductor element in which an electronic circuit for exchanging signals with the imaging element 100 is arranged. As the semiconductor element 200, for example, a semiconductor element in which a processing circuit for processing an image signal generated by the imaging element 100 is arranged can be used. Further, for example, a semiconductor element in which a control circuit for generating a control signal for the imaging element 100 and supplying the signal to the imaging element 100 is arranged can be used as the semiconductor element 200.

The semiconductor element 200 includes a semiconductor chip 210. Pads 250 are arranged on the bottom surface of the semiconductor chip 210. Bumps 260 are arranged on the pad 250. Further, an insulation film 240 is arranged on the bottom surface of the semiconductor element 200. The side surfaces of the pad 250 and the bump 260 are formed so as to be covered with the insulation film 240. Note that the semiconductor element 200 is an example of the second semiconductor element described in the claims.

A wiring layer 25 is arranged on the wiring substrate 20. The wiring layer 25 is a wiring layer connected in common to the bump 160 of the imaging element 100 and the bump 260 of the semiconductor element 200. Signals can be exchanged between the imaging element 100 and the semiconductor element 200 via this wiring layer 25.

In this way, by arranging the semiconductor element 200 having the processing circuit for the imaging element 100, or the like, in one package, the entire system can be miniaturized.

In the imaging device 10 of the figure, since the semiconductor element 200 having a thickness different from that of the imaging element 100 is arranged, the manufacturing method described in FIGS. 8A, 8B, 8C, 9A, 9B, 10A, and 10B can be applied.

Incidentally, the configuration of the imaging device 10 is not limited to this example. For example, a configuration in which two or more semiconductor elements are arranged in a package together with the imaging element 100 can also be employed. For example, a semiconductor element in which the control circuit for the imaging element 100 is arranged and a semiconductor element in which the processing circuit for the image signal from the imaging element 100 is arranged can be arranged. In this case, the sealing portion 40 seals the imaging element 100 and a plurality of semiconductor elements.

Since the configuration of the imaging device 10 other than this is similar to that of the imaging device 10 described in the first embodiment of the present disclosure, the description thereof will be omitted.

As described above, in the imaging device 10 of the fifth embodiment of the present disclosure, the entire system can be miniaturized by further arranging the semiconductor elements 200.

6. Sixth Embodiment

Figure 14:
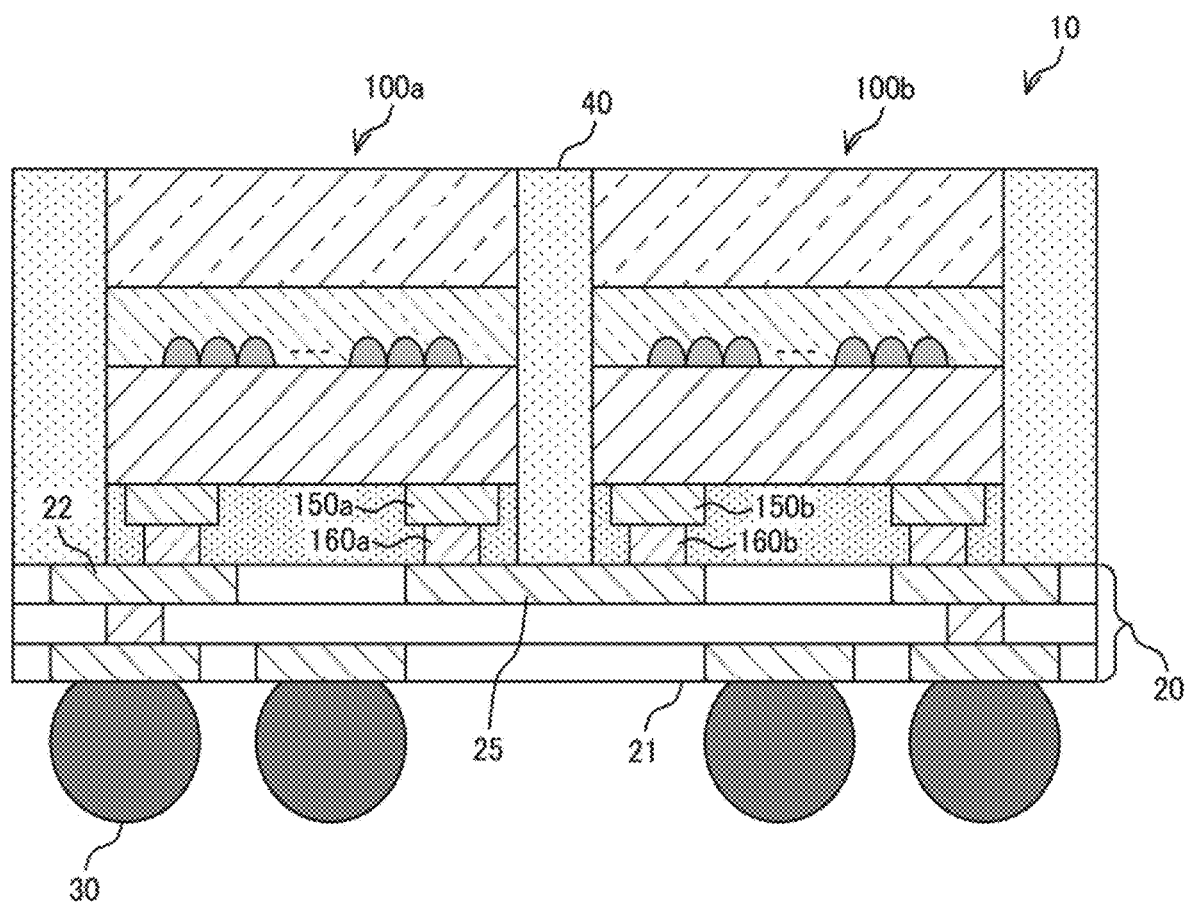
FIG. 14 is a cross-sectional view illustrating a configuration example of an imaging device according to a sixth embodiment of the present disclosure.

In the imaging device 10 of the fifth embodiment described above, the imaging element 100 and the semiconductor element 200 are enclosed in a package. On the other hand, the imaging device 10 of the sixth embodiment of the present disclosure is different from that of the above-mentioned fifth embodiment in that a plurality of imaging elements is enclosed in a package.
[Structure of Cross Section of Imaging Device]
FIG. 14 is a cross-sectional view illustrating a configuration example of the imaging device according to the sixth embodiment of the present disclosure. The figure is a diagram illustrating a configuration example of the imaging device 10 as in FIG. 13. The imaging device 10 differs from that of FIG. 13 in that an imaging element is arranged instead of the semiconductor element 200.

The imaging device 10 in the figure is provided with two imaging elements 100a and 100b arranged and is formed as a multi-lens imaging device. That is, in the imaging device 10 of the figure, the imaging element 100b is arranged instead of the semiconductor element 200 in FIG. 13. Note that the former imaging element 100 is identified by adding "a" to the reference sign. The imaging elements 100a and 100b are mounted on the wiring substrate 20. The wiring layer 25 in the figure is connected in common to a bump 160a of the imaging element 100a and a bump 160b of the imaging element 100b. The wiring layer 25 corresponds to a wiring layer that constitutes a signal line which transmits a common signal of the imaging elements 100a and 100b, for example, a power supply line. Note that the imaging element 100b is an example of the second imaging element described in the claims.

By arranging the imaging elements 100a and 100b in one package in this way, the multi-lens imaging device 10 can be miniaturized.

In the imaging device 10 of the figure, since the imaging elements 100a and 100b having the same thickness are arranged, the manufacturing methods described in FIGS. 3A, 3B, 3C, 4A, 4B, 4C, 5A, 5B, 6A, 6B,8A, 8B, 8C, 9A. 9B,10A, and 10B can be applied.

Incidentally, the configuration of the imaging device 10 is not limited to this example. For example, a configuration in which three or more imaging elements 100 are arranged in a package can also be employed.

Since the configuration of the imaging device 10 other than this is similar to that of the imaging device 10 described in the fifth embodiment of the present disclosure, the description thereof will be omitted.

As described above, in the imaging device 10 of the sixth embodiment of the present disclosure, the multi-lens imaging device can be miniaturized by arranging the plurality of imaging elements 100a and 100b.

7. Seventh Embodiment

Figure 15:
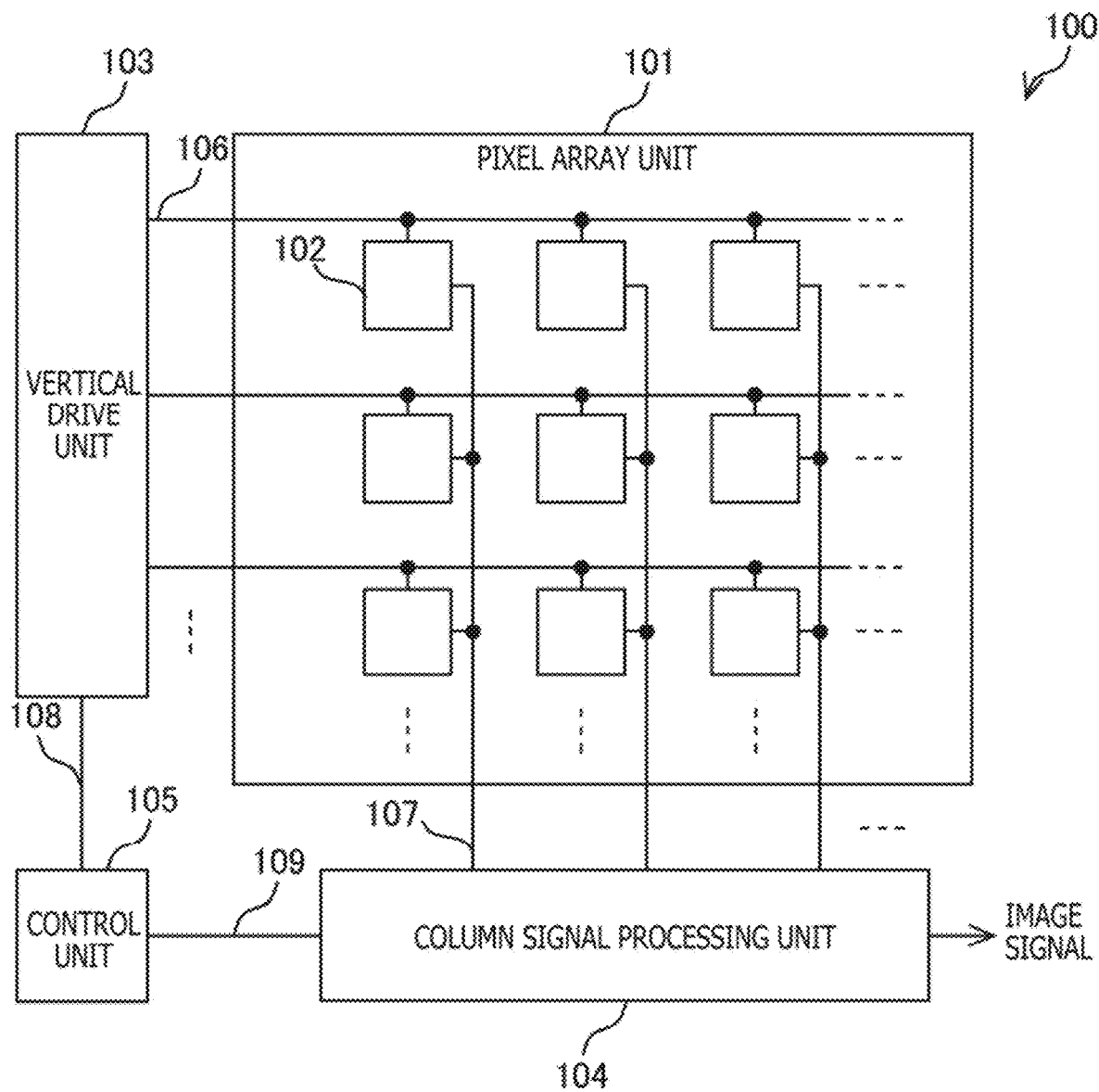
FIG. 15 is a diagram illustrating a configuration example of an imaging element according to an embodiment of the present disclosure.

In the above-described embodiment, the imaging element 100 is used. In the seventh embodiment of the present disclosure, the configuration of the imaging element 100 will be described.
[Structure of imaging Element]
FIG. 15 is a diagram illustrating a configuration example of the imaging element according to the embodiment of the present disclosure. The imaging element 100 in the figure includes a pixel array unit 101, vertical drive unit 103, column signal processing unit 104, and control unit 105.

The pixel array unit 101 is configured by arranging the pixels 102 in a two-dimensional grid pattern. Here, the pixel 102 generates an image signal according to the light with which the pixel 102 is irradiated. The pixel 102 has a photoelectric conversion unit that generates an electric charge according to the irradiation light. Further, the pixel 102 further has a pixel circuit. This pixel circuit generates an image signal based on the electric charge generated by the photoelectric conversion unit. The generation of the image signal is controlled by the control signal generated by the vertical drive unit 103 to be described later. Signal lines 106 and 107 are arranged in the pixel array unit 101 in an XY matrix. The signal line 106 is a signal line that transmits a control signal of the pixel circuit in the pixel 102, and is laid for each row of the pixel array unit 101, to be arranged in common to the pixels 102 placed in each row. The signal line 107 is a signal line for transmitting an image signal generated by the pixel circuit of the pixel 102, is laid for each column of the pixel array unit 101, to be arranged in common to the pixels 102 placed in each column. These photoelectric conversion units and pixel circuits are formed on a semiconductor substrate.

The vertical drive unit 103 generates a control signal for the pixel circuit of the pixel 102. The vertical drive unit 103 transmits the generated control signal to the pixel 102 via the signal line 106 in the figure. The column signal processing unit 104 processes the image signal generated by the pixel 102. This column signal processing unit 104 processes the image signal transmitted from the pixel 102 via the signal line 107 in the figure. The processing in the column signal processing unit 104 corresponds to, for example, analog-digital conversion for converting an analog image signal generated in the pixel 102 into a digital image signal. The image signal processed by the column signal processing unit 104 is output as an image signal of the imaging element 100. The control unit 105 controls the entire imaging element 100. This control unit 105 controls the imaging element 100 by generating and outputting control signals for controlling the vertical drive unit 103 and the column signal processing unit 104. The control signal generated by the control unit 105 is transmitted to the vertical drive unit 103 and the column signal processing unit 104 by signal lines 108 and 109, respectively.

8. Application Example to Camera

The technique related to the present disclosure (the present technique) can be applied to various products. For example, the present technique may be realized as an imaging element mounted on an imaging device such as a camera.

Figure 16:
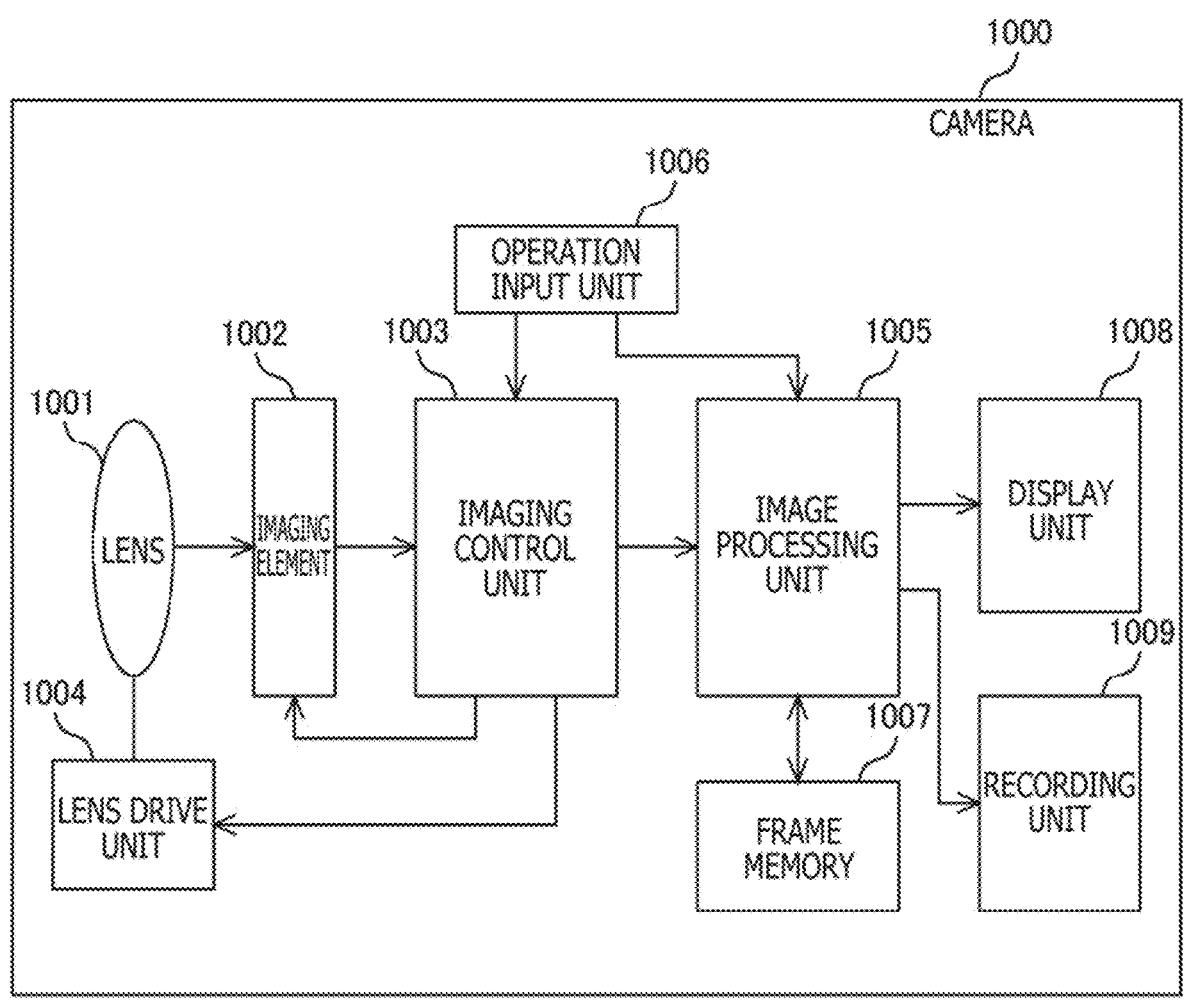
FIG. 16 is a block diagram illustrating a schematic configuration example of a camera which is an example of the imaging device to which the present technique can be applied.

FIG. 16 is a block diagram illustrating a schematic configuration example of a camera which is an example of an imaging device to which the present technique can be applied. A camera 1000 in the figure is provided with a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an image pickup lens of the camera 1000. This lens 1001 collects light from a subject and causes the light to be incident on the imaging element 1002 to be described later to form an image of the subject.

The imaging element 1002 is a semiconductor element that captures an image from light obtained by collecting light from the subject with the lens 1001. This imaging element 1002 generates an analog image signal corresponding to the irradiation light, converts the signal into a digital image signal, and outputs the signal.

The imaging control unit 1003 controls the image pickup of the imaging element 1002. This imaging control unit 1003 controls the imaging element 1002 by generating a control signal and outputting the control signal to the imaging element 1002. Further, the imaging control unit 1003 can perform autofocusing on the camera 1000 on the basis of the image signal output from the imaging element 1002. Here, the autofocusing is a system that detects a focal position of the lens 1001 and automatically makes adjustment. As this autofocusing, a method in which the image plane phase difference is detected by the phase difference pixels arranged in the imaging element 1002 to detect the focal position (image plane phase difference autofocusing) can be used. Further, a method of detecting a position where the contrast of the image is highest as the focal position (contrast autofocusing) can also be applied. The imaging control unit 1003 adjusts a position of the lens 1001 via the lens drive unit 1004 on the basis of the detected focal position, and performs autofocusing. Incidentally, the imaging control unit 1003 can be configured by a DSP (Digital Signal Processor) equipped with firmware, for example.

The lens drive unit 1004 drives the lens 1001 on the basis of the control of the imaging control unit 1003. The lens drive unit 1004 can drive the lens 1001 by changing the position of the lens 1001 by using a built-in motor.

The image processing unit 1005 processes the image signal generated by the imaging element 1002. This processing includes demosaic processing to generate an image signal of a color that is insufficient among the image signals corresponding to red, green, and blue for each pixel, noise reduction to remove noise of the image signal, encoding of the image signal, and the like, for example. The image processing unit 1005 can be configured by a microcomputer equipped with firmware, for example.

The operation input unit 1006 receives an operation input from the user of the camera 1000. For example, a push button or a touch panel can be used for the operation input unit 1006. The operation input received by the operation input unit 1006 is transmitted to the imaging control unit 1003 or the image processing unit 1005. After that, processing according to the operation input, for example, processing of image pickup of the subject is activated.

The frame memory 1007 is a memory for storing a frame which is an image signal for one picture. The frame memory 1007 is controlled by the image processing unit 1005 and holds frames in the course of image processing.

The display unit 1008 displays an image processed by the image processing unit 1005. For example, a liquid crystal panel can be used for the display unit 1008.

The recording unit 1009 records the image processed by the image processing unit 1005. For example, a memory card or a hard disk can be used for the recording unit 1009.

The cameras to which the present disclosure can be applied have been described above. The present technique can be applied to the imaging element 1002 among the configurations described above. To be specific, the imaging device 10 described with reference to FIG. 1 can be applied to the imaging element 1002. By applying the imaging device 10 to the imaging element 1002, the camera 1000 can be miniaturized.

Finally, the description of each embodiment described above is an example of the present disclosure, and the present disclosure is not limited to the above-described embodiments. Therefore, it is obvious that various modifications can be made according to the design and the like as long as there is no deviation from the technical idea according to the present disclosure, even if the modification is other than each of the above-described embodiments.

Further, the effects described in the present specification are merely examples and the effect is not limited thereto. In addition, there may also be other effects.

Further, the drawings in the above-described embodiment are schematic, and the ratio of dimensions of each part and the like do not always match the actual one. In addition, it is obvious that parts having different dimensional relations and ratios are included between the drawings.

It should be noted that the present technique can also have the following configurations.

(1) An imaging device including:
an imaging element including an image pickup chip over which a light transmitting portion transmitting incident light is arranged and which generates an image signal on the basis of the incident light transmitted through the light transmitting portion and a pad which is arranged on a bottom surface that is a surface of the image pickup chip different from a surface on which the light transmitting portion is arranged, the pad transmitting the generated image signal;
a wiring substrate which has wiring connected to the pad and extending to a region outside the imaging element, the imaging element being arranged on a front surface of the wiring substrate; and
a sealing portion which is arranged adjacent to a side surface of the imaging element, which is a surface adjacent to a bottom surface of the imaging element, the sealing portion sealing the imaging element.

(2) The imaging device described in the above item (1), in which
the imaging element further includes a protrusion arranged on the pad, and
the wiring substrate includes the wiring connected to the pad via the protrusion.

(3) The imaging device described in the above item (1) or (2), in which
the imaging element further includes an insulation film arranged on the bottom surface of the image pickup chip.

(4) The imaging device described in the above item (1), in which
the imaging element having been sealed by the sealing portion is arranged on the wiring substrate.

(5) The imaging device described in the above item (1), in which
the sealing portion performs the sealing of the imaging element having been arranged on the wiring substrate.

(6) The imaging device described in any one of the above items (1) to (5), further including:
a connecting portion which is arranged on a back surface that is a surface different from the front surface of the wiring substrate, the connecting portion being connected to the wiring.

(7) The imaging device described in any one of the above items (1) to (6), further including:
a second semiconductor element arranged on the wiring substrate, in which
the sealing portion further seals a side surface of the second semiconductor element.

(8) The imaging device described in the above item (7), in which
the second semiconductor element includes a processing circuit that processes the output image signal.

(9) The imaging device described in the above item (7), in which
the second semiconductor element includes a second imaging element.

(10) The imaging device described in the above item (7), in which
a plurality of the second semiconductor elements is arranged on the wiring substrate, and
the sealing portion further seals side surfaces of the plurality of the second semiconductor elements.

(11) The imaging device described in any one of the above items (1) to (10), in which
the light transmitting portion includes glass.

(12) The imaging device described in any one of the above items (1) to (10), in which
the light transmitting portion includes a resin.

(13) A method for manufacturing an imaging device with the method including:
a wiring substrate arranging step of arranging an imaging element on a front surface of a wiring substrate, the imaging element including an image pickup chip over which a light transmitting portion transmitting incident light is arranged and which generates an image signal on the basis of the incident light transmitted through the light transmitting portion and a pad which is arranged on a bottom surface that is a surface of the image pickup chip different from a surface on which the light transmitting portion is arranged, the pad transmitting the generated image signal, the wiring substrate having wiring connected to the pad and extending to a region outside the imaging element; and
a sealing step of arranging a sealing member on a side surface of the imaging element, which is a surface adjacent to a bottom surface of the imaging element.

REFERENCE SIGNS LIST

10: Imaging device
20: Wiring substrate
21: Insulation layer
22, 25: Wiring layer
23: Via
24: Wiring substrate pad
30: Connecting portion
40: Sealing portion
100, 100a, 100b: Imaging element
101: Pixel array unit
102: Pixel
103: Vertical drive unit
104: Column signal processing unit
105: Control unit
110: Image pickup chip
111: On-chip lens
120: Adhesive
121: Spacer
122: Gap
130: Light transmitting portion
140, 240: Insulation film
150, 250: Pad
160, 160a, 160b, 260: Bump
200: Semiconductor element
210: Semiconductor chip
1000: Camera

The invention claimed is:
1. An imaging device, comprising:
a first imaging element including a light transmitting portion above an image pickup chip, wherein
the first imaging element has side surfaces,
the light transmitting portion is configured to transmit incident light, and
the image pickup chip is configured to generate an image signal based on the incident light transmitted through the light transmitting portion;
a pad on a bottom surface of the image pickup chip, wherein
the bottom surface of the image pickup chip is different from a top surface of the image pickup chip on which the light transmitting portion is arranged, and
the pad is configured to transmit the generated image signal;
a wiring substrate that includes wiring connected to the pad and the wiring substrate extends to a region outside the first imaging element, wherein the first imaging element is on a front surface of the wiring substrate;
a second imaging element adjacent to the first imaging element, wherein the second imaging element has side surfaces; and a sealing portion in contact with the side surfaces of the first imaging element and the side surfaces of the second imaging element, wherein
the side surfaces of the first imaging element are adjacent to a bottom surface of the first imaging element, and
the sealing portion is configured to seal the first imaging element.

2. The imaging device according to claim 1, wherein the first imaging element further includes a protrusion arranged on the pad, and
the wiring substrate includes the wiring connected to the pad via the protrusion.

3. The imaging device according to claim 1, wherein the first imaging element further includes an insulation film on the bottom surface of the image pickup chip.

4. The imaging device according to claim 1, wherein the sealing portion is further configured to seal the second imaging element.

5. The imaging device according to claim 1, wherein the sealing portion includes a resin.

6. The imaging device according to claim 1, further comprising a connecting portion on a back surface of the wiring substrate that is a surface different from the front surface of the wiring substrate,
wherein the connecting portion is connected to the wiring.

7. The imaging device according to claim 1, wherein the second imaging element is on the front surface of the wiring substrate.

8. The imaging device according to claim 1, wherein the second imaging element includes a processing circuit, and
the processing circuit is configured to process the image signal.

9. The imaging device according to claim 1, further comprising a plurality of imaging elements on the wiring substrate, wherein
the plurality of imaging elements includes the first imaging element and the second imaging element, and
the sealing portion is further configured to seal side surfaces of each of the plurality of imaging elements.

10. The imaging device according to claim 1, wherein the light transmitting portion includes glass.

11. The imaging device according to claim 1, wherein the light transmitting portion includes a resin.

12. A method for manufacturing an imaging device, the method comprising:
arranging a first imaging element on a front surface of a wiring substrate, wherein
the first imaging element has side surfaces,
the first imaging element includes a light transmitting portion above an image pickup chip,
the light transmitting portion is configured to transmit incident light,
the image pickup chip is configured to generate an image signal based on of the incident light transmitted through the light transmitting portion,
a pad is on a bottom surface of the image pickup chip,
the bottom surface of the image pickup chip is different from a top surface of the image pickup chip on which the light transmitting portion is arranged,
the pad is configured to transmit the generated image signal, and
the wiring substrate includes wiring connected to the pad and extending to a region outside the first imaging element,
arranging a second imaging element adjacent to the first imaging element, wherein the second imaging element has side surfaces; and
arranging a sealing member in contact with the side surfaces of the first imaging element and the side surfaces of the second imaging element, wherein the side surfaces of the first imaging element are adjacent to a bottom surface of the first imaging element.

* * * * *